US011430767B2

(12) United States Patent
Lee et al.

(10) Patent No.: US 11,430,767 B2
(45) Date of Patent: Aug. 30, 2022

(54) SEMICONDUCTOR PACKAGE INCLUDING STACKED SEMICONDUCTOR CHIPS

(71) Applicant: SK hynix Inc., Icheon-si (KR)

(72) Inventors: Chaesung Lee, Icheon-si (KR); Jonghoon Kim, Suwon-si (KR); Bokkyu Choi, Yongin-si (KR); Kijun Sung, Cheongju-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/899,359

(22) Filed: Jun. 11, 2020

(65) Prior Publication Data
US 2021/0098425 A1  Apr. 1, 2021

(30) Foreign Application Priority Data
Oct. 1, 2019 (KR) ........................ 10-2019-0121521

(51) Int. Cl.
   *H01L 25/065* (2006.01)
(52) U.S. Cl.
   CPC .............................. *H01L 25/0657* (2013.01); *H01L 2225/06548* (2013.01); *H01L 2225/06562* (2013.01); *H01L 2225/06586* (2013.01)
(58) Field of Classification Search
   CPC ....... H01L 25/0657; H01L 2225/06548; H01L 2225/06562; H01L 2225/06586
   See application file for complete search history.

(56) References Cited

U.S. PATENT DOCUMENTS

| 10,128,211 | B2  |   | 11/2018 | Chang et al. |
| 2010/0193930 | A1 | * | 8/2010 | Lee ................... H01L 23/5389 257/686 |
| 2019/0067248 | A1 | * | 2/2019 | Yoo ................... H01L 21/6835 |
| 2019/0229092 | A1 | * | 7/2019 | Ding ................... H01L 24/81 |

FOREIGN PATENT DOCUMENTS

KR  1020170070779 A  6/2017

OTHER PUBLICATIONS

Chandrasekharan Nair et al., Effect of Ultra-Fine Pitch RDL Process Variations on the Electrical Performance of 2.5D Glass Interposers up to 110 GHz, 2016 IEEE 66th Electronic Components and Technology Conference, May 31-Jun. 3, 2016, pp. 2408-2413, Institute of Electrical and Electronics Engineers, Las Vegas, NV, USA.

* cited by examiner

*Primary Examiner* — Timor Karimy
(74) *Attorney, Agent, or Firm* — William Park & Associates Ltd.

(57) ABSTRACT

A semiconductor package may include: a chip stack including a plurality of semiconductor chips stacked in a vertical direction; vertical interconnectors, each having first ends that are connected to the plurality of semiconductor chips, respectively, and extending in the vertical direction; a molding layer covering the chip stack and the vertical interconnectors while exposing second ends of the vertical interconnectors; landing pads formed over one surface of the molding layer to be in contact with the second ends of the vertical interconnectors, respectively, wherein the landing pads are conductive and overlap the first ends of the vertical interconnectors, respectively; and a package redistribution layer electrically connected to the vertical interconnectors through the landing pads.

24 Claims, 23 Drawing Sheets

SEMICONDUCTOR PACKAGE INCLUDING STACKED SEMICONDUCTOR CHIPS

CROSS-REFERENCE TO RELATED APPLICATION

This application claims priority under 35 U.S.C. § 119 to Korean Patent Application No. 10-2019-0121521 filed on Oct. 1, 2019, which is incorporated herein by reference in its entirety.

BACKGROUND

1. Technical Field

The present disclosure generally relates to a semiconductor package, and more particularly, to a semiconductor package including a plurality of chips stacked therein.

2. Related Art

Electronic products are required to process larger amounts of data while the physical size continues to get smaller. Thus, it is necessary to increase the degree of integration of a semiconductor device that is used in such electronic products.

However, due to the limitations of the semiconductor integration technology, required functions cannot be satisfied by only a single semiconductor chip. Thus, a semiconductor package with a plurality of semiconductor chips, embedded therein, needs to be fabricated.

Although a semiconductor package includes a plurality of semiconductor chips, the semiconductor package is required to have a designated size or a size smaller than the designated size based on the requirements of the electronic product in which the semiconductor package is to be mounted.

SUMMARY

In an embodiment, a semiconductor package may include: a chip stack including a plurality of semiconductor chips stacked in a vertical direction; vertical interconnectors having first ends connected to the semiconductor chips, respectively, and extending in the vertical direction; a molding layer covering the chip stack and the vertical interconnectors while exposing second ends of the vertical interconnectors; landing pads formed over one surface of the molding layer to be in contact with the second ends of the vertical interconnectors, respectively, where the landing pads are conductive and overlap the first ends of the vertical interconnectors, respectively; and a package redistribution layer electrically connected to the vertical interconnectors through the landing pads.

In another embodiment, a method of fabricating a semiconductor package may include: stacking a plurality of semiconductor chips to form a chip stack on a substrate in a vertical direction; forming vertical interconnectors, first ends of the vertical connectors being connected to the plurality of semiconductor chips, respectively, extending in the vertical direction; forming a molding layer to cover the chip stack and the vertical interconnectors while exposing second ends of the vertical interconnectors; forming landing pads over the molding layer to be in contact with the second ends of the vertical interconnectors, respectively, wherein the landing pads are conductive and overlap the first ends of the vertical interconnectors, respectively; and forming a package redistribution layer that is electrically connected to the vertical interconnectors through the landing pads.

DETAILED DESCRIPTION

Figure 1A:
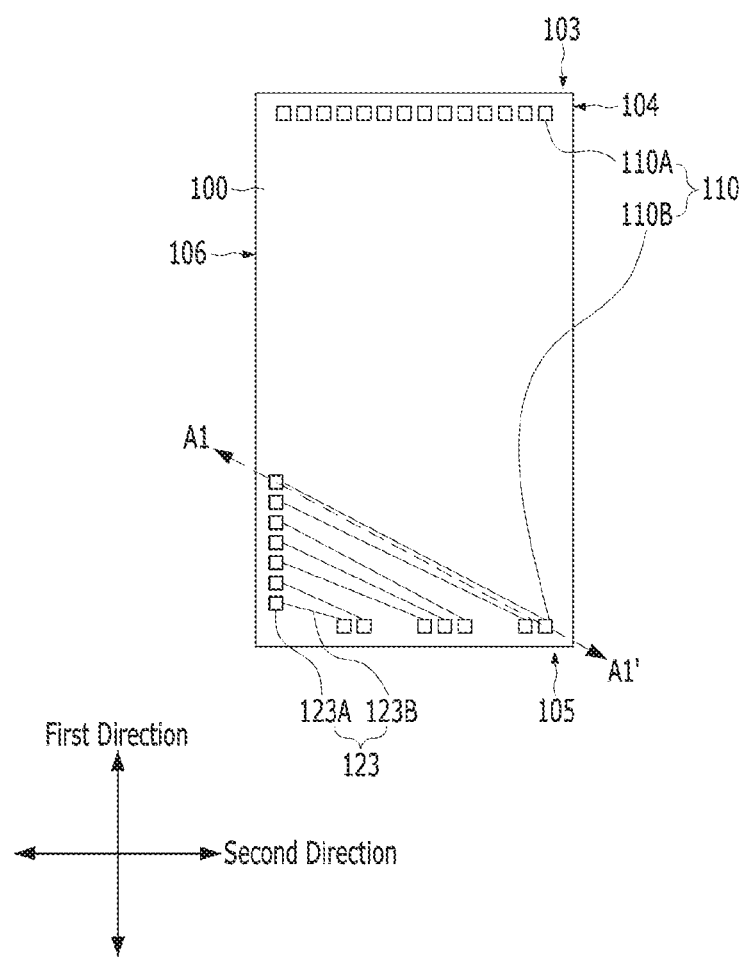
FIG. 1A is a planar view, illustrating an active surface of a semiconductor chip, in accordance with an embodiment.

Various examples and implementations of the disclosed technology are described below with reference to the accompanying drawings.

The drawings might not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure might not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

In the following description of the embodiments, when a parameter is referred to as being "predetermined", it may be intended to mean that a value of the parameter is determined in advance when the parameter is used in a process or an algorithm. The value of the parameter may be set when the process or the algorithm starts or may be set during a period that the process or the algorithm is executed.

It will be understood that although the terms "first", "second", "third" etc. are used herein to describe various elements, these elements should not be limited by these terms. These terms are only used to distinguish one element from another element. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Various embodiments are directed to a semiconductor package which has a small thickness and can satisfy high-performance and high-capacity requirements while reducing process defects through a method for stacking a plurality of semiconductor chips and connecting the semiconductor chips to a redistribution layer using vertical interconnectors.

Figure 1B:
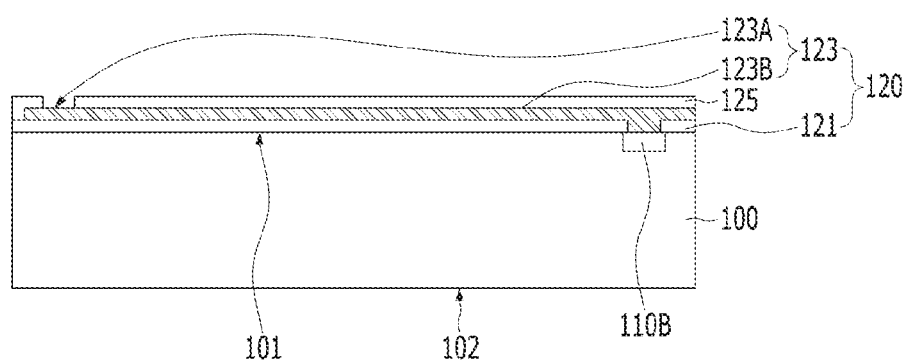
FIG. 1B is a cross-sectional view that is taken along a line A1-A1' of FIG. 1A.

FIG. 1A is a planar view, illustrating an active surface of a semiconductor chip, in accordance with an embodiment, and FIG. 1B is a cross-sectional view that is taken along a line A1-A1' of FIG. 1A.

Referring to FIGS. 1A and 1B, the semiconductor chip 100 may include an active surface 101 with chip pads 110 disposed thereon, an inactive surface 102 that is located on the opposite side of the active surface 101, and side surfaces 103, 104, 105, and 106, connecting the active surface 101 and the inactive surface 102.

Since the semiconductor chip 100 has a planar rectangular shape or a similar shape thereto, the semiconductor chip 100 may include four side surfaces 103, 104, 105 and 106. Among the side surfaces 103, 104, 105 and 106, the side surfaces 103 and 105, facing each other in a first direction that is parallel to the active surface 101 and/or the inactive surface 102 of the semiconductor chip 100, will be referred to as a first side surface 103 and a third side surface 105. Furthermore, the side surfaces 104 and 106, facing each other in a second direction that is perpendicular to the first direction while being parallel to the active surface 101 and/or the inactive surface 102 of the semiconductor chip 100, will be referred to as a second side surface 104 and a fourth side surface 106. In an embodiment, the first and third side surfaces 103 and 105 may have a smaller length than the second and fourth side surfaces 104 and 106. However, the present embodiments are not limited thereto, and the lengths of the side surfaces may be set to various values.

The chip pads 110 may be disposed at both edge areas of the active surface 101 in the first direction, i.e. the edge area that is adjacent to the first side surface 103 and the edge area that is adjacent to the third side surface 105. That is, the chip pads 110 may be disposed in an edge-pad type. Among the chip pads 110, the chip pads 110 that are disposed at the edge area, close to the first side surface 103, will be referred to as one-side chip pads 110A. The chip pads 110 that disposed at the edge area, close to the third side surface 105, will be referred to as other-side chip pads 110B. In an embodiment, the one-side chip pads 110A may be arranged in a line along the second direction, and the other-side chip pads 110B may also be arranged in a line along the second direction. However, the present embodiments are not limited thereto, and the one-side chip pads 110A and/or the other-side chip pads 110B may be arranged in various manners at both edge areas in the first direction. In an embodiment, the number of one-side chip pads 110A may be larger than the number of other-side chip pads 110B. However, the present embodiments are not limited thereto, and the number of the one-side chip pads 110A and the number of the other-side chip pads 110B may be set to various values. In an embodiment, the chip pads 110 may have a planar rectangular shape. However, the present embodiments are not limited thereto, and the planar shape of the chip pads 110 may be modified in various manners.

When such semiconductor chips 100 are stacked in a vertical direction, it is difficult to expose the one-side chip pads 110A and the other-side chip pads 110B at the same time regardless of method used to stack the semiconductor chips 100. In order to solve such a problem, the semiconductor chip 100 may further include a chip redistribution layer 120 that is formed on the active surface 101.

The chip redistribution layer 120 may include redistribution dielectric layers 121 and 125 and a redistribution conductive layer 123.

For example, the redistribution conductive layer 123 may include redistribution pads 123A and redistribution lines 123B, which are located in a planar view, illustrated in FIG. 1A. The redistribution pads 123A may be disposed at an edge area that is close to the fourth side surface 106 between both edge areas in the second direction. The redistribution lines 123B may be extended from the redistribution pads 123A to the other-side chip pads 110B. In an embodiment, the redistribution pads 123A may be arranged in a line along the first direction while the number of redistribution pads 123A is set to the same value as the number of other-side chip pads 110B so that the redistribution pads 123A correspond, one-to-one, to the other-side chip pads 110B. However, the present embodiments are not limited thereto, and the number and arrangement of redistribution pads 123A may be modified in various manners. In an embodiment, the redistribution pads 123A may be disposed at the edge area that is close to the fourth side surface 106. However, the present embodiments are not limited thereto, and the redistribution pads 123A may be disposed at the edge area that is close to the second side surface 104. The edge area where the redistribution pads 123A are disposed, between both edge areas in the second direction, may be decided based on an offset stacking direction of the semiconductor chip 100, which will be described below. In an embodiment, the redistribution pads 123A may be electrically coupled to the other-side chip pads 110B. However, the present embodiments are not limited TO thereto, and the redistribution pads 123A may be electrically coupled to the one-side chip pads 110A. The chip pads to which the redistribution pads 123A are connected, between the one-side chip pads 110A and the other-side chip pads 110B, may be decided based on the offset stacking direction of the semiconductor chip 100, which will be described below. When the redistribution pads 123A are electrically coupled to the other-side chip pads 110B, the redistribution pads 123A may be disposed relatively close to the third side surface 105 in the first direction as illustrated in FIG. 1A, which makes it possible to shorten the connection paths to the other-side chip pads 110B. On the other hand, when the redistribution pads 123A are connected to the one-side chip pads 110A, the redistribution pads 123A may be disposed relatively close to the first side surface 103 in the first direction, in the opposite way of the illustrated structure. When the redistribution pads 123A are connected to the other-side chip pads 110B, the other-side chip pads 110B being fewer than the one-side chip pads 110A, the routing path through the chip redistribution layer 120 and a package redistribution layer 600 (see FIG. 7) can be relatively simplified. In an embodiment, the redistribution pads 123A may have the same or similar planar rectangular shape as or to the chip pads 110. For convenience of description, the redistribution pads 123A are represented by thicker solid lines compared to the chip pads 110. However, the present embodiments are not limited thereto, and the planar shape of the redistribution pads 123A may be modified in various manners. The redistribution lines 123B may be formed not to cross each other. For this structure, the redistribution pads 123A and the other-side chip pads 110B may be respectively connected to each other in ascending order of distance therebetween.

Referring to the cross-section, illustrated in FIG. 1B, the redistribution conductive layer 123 may be covered by the redistribution dielectric layers 121 and 125, except portions that are exposed through openings of the redistribution dielectric layers 121 and 125, to electrically isolate the redistribution conductive layer 123 from other components. The first redistribution dielectric layer 121, covering the active surface 101 of the semiconductor chip 100, may have openings that expose the chip pads 110. The redistribution lines 123B may fill the openings of the first redistribution dielectric layer 121 to be electrically coupled to the chip pads 110. The redistribution lines 123B may be extended over the first redistribution dielectric layer 121. The redistribution line 123B may be extended in a line shape with a small width. The redistribution line 123B may have an end with a relatively large width. The second redistribution dielectric layer 125 may have openings to expose the ends of the redistribution lines 123B, while covering the redistribution lines 123B and the first redistribution dielectric layer 121. Portions of the ends of the redistribution lines 123B, exposed through the openings that are formed in the second redistribution dielectric layer 125, may constitute the redistribution pads 123A.

The semiconductor chip 100, in accordance with an embodiment, may include a mobile dynamic random access memory (DRAM). However, the present embodiments are not limited thereto, and the semiconductor chip 100 may include a nonvolatile memory such as a flash memory, a phase change RAM (PRAM), or a magneto-resistive RAM (MRAM) or a volatile memory, such as a DRAM or a static RAM (SRAM).

The above-described plurality of semiconductor chips 100 may be stacked in a vertical direction to form a semiconductor package. This structure will be described with reference to FIGS. 2A, 2B, 3A, 3B, 4A, 4B, 5A, 5B, 6, and 7.

Figure 4A:
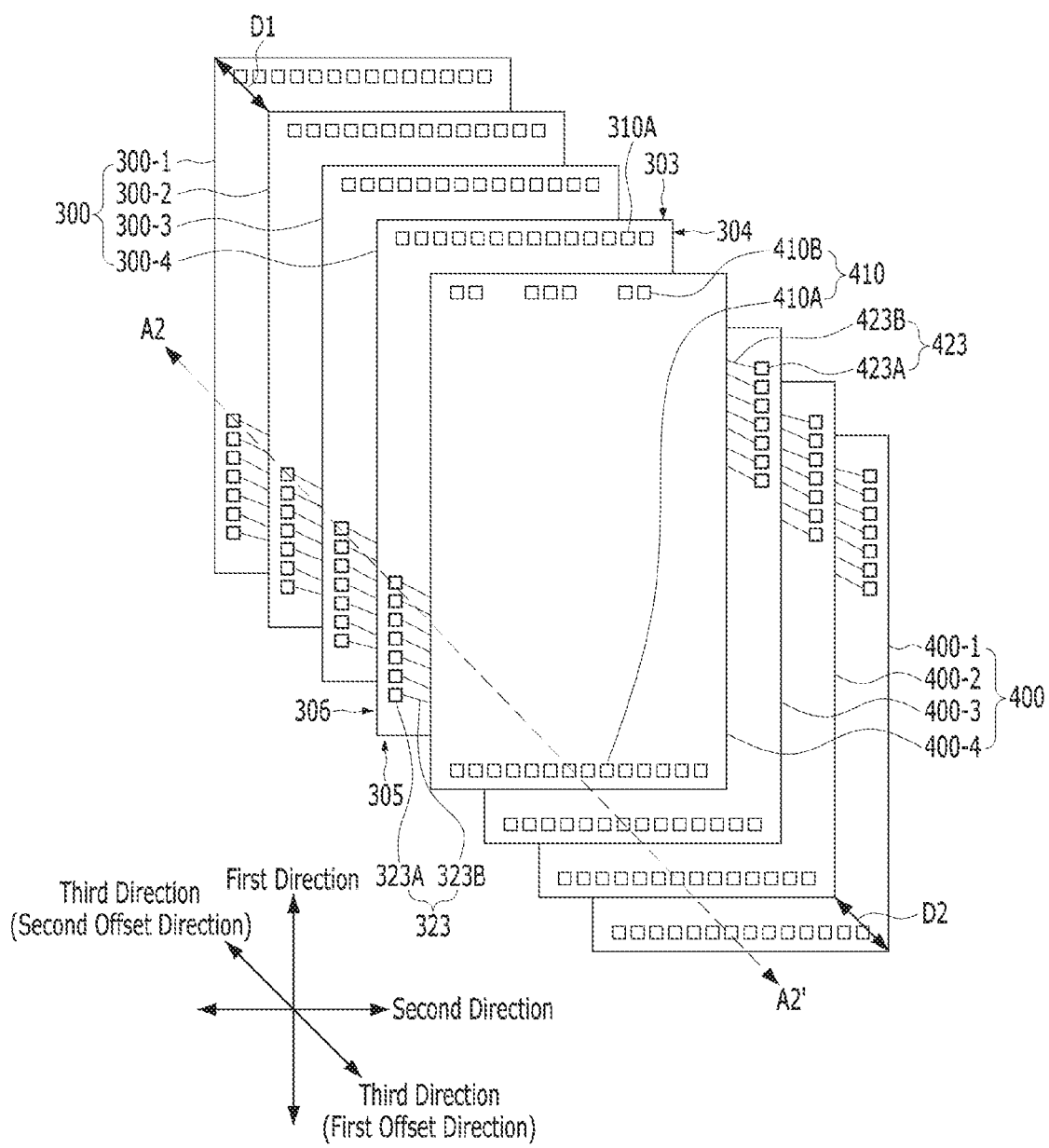
Figure 4B:
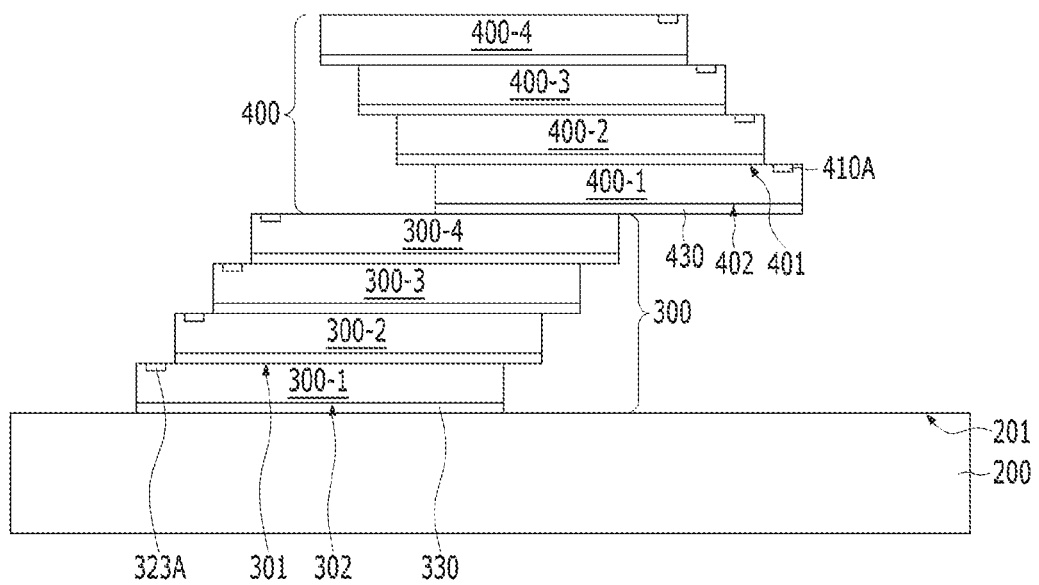
Figure 5A:
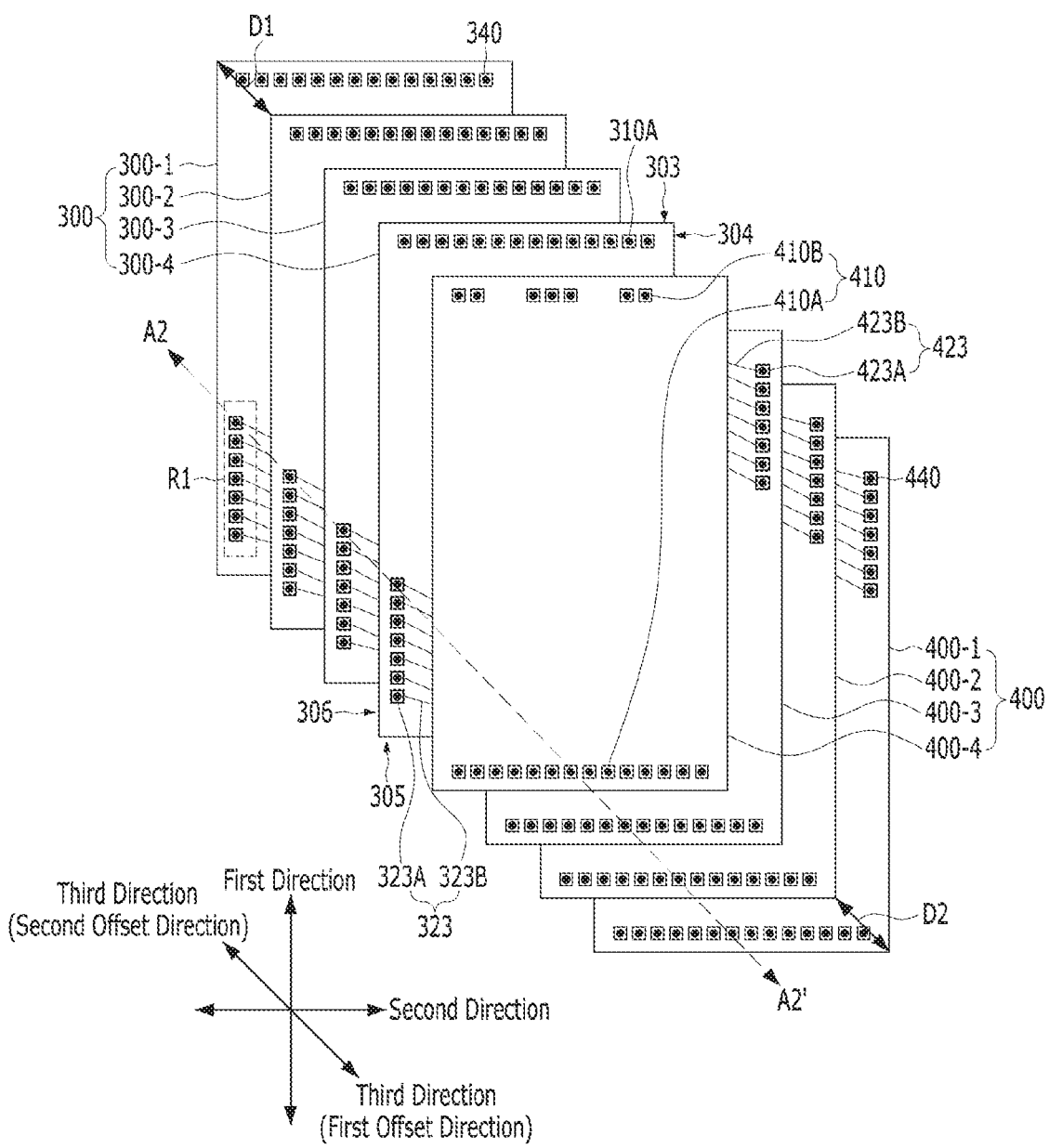
Figure 5B:
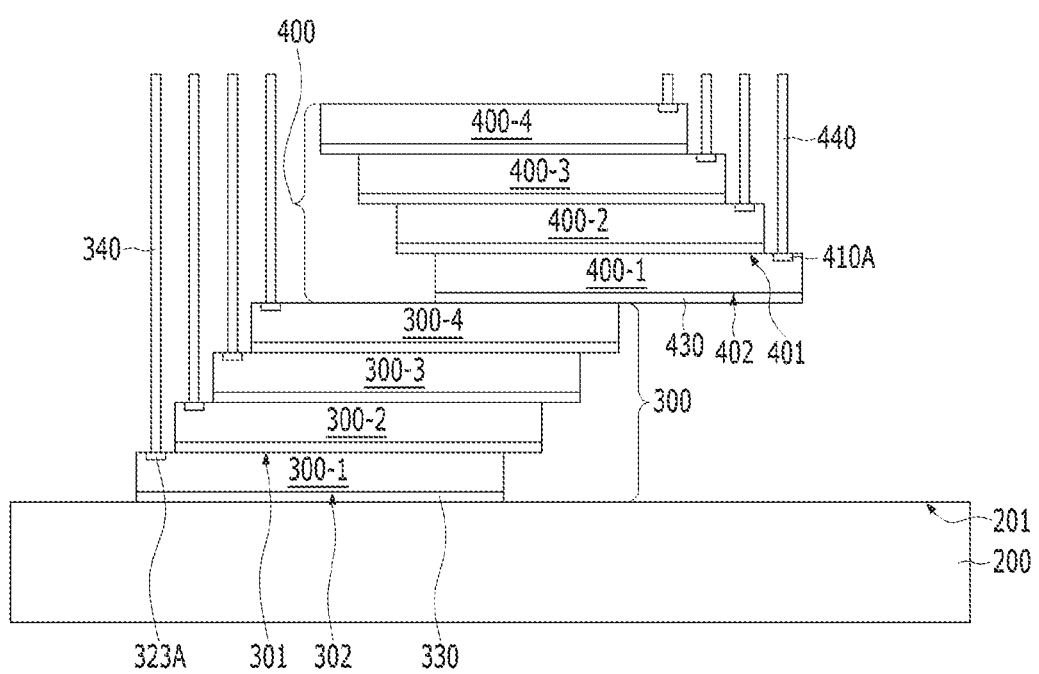
Figure 6:
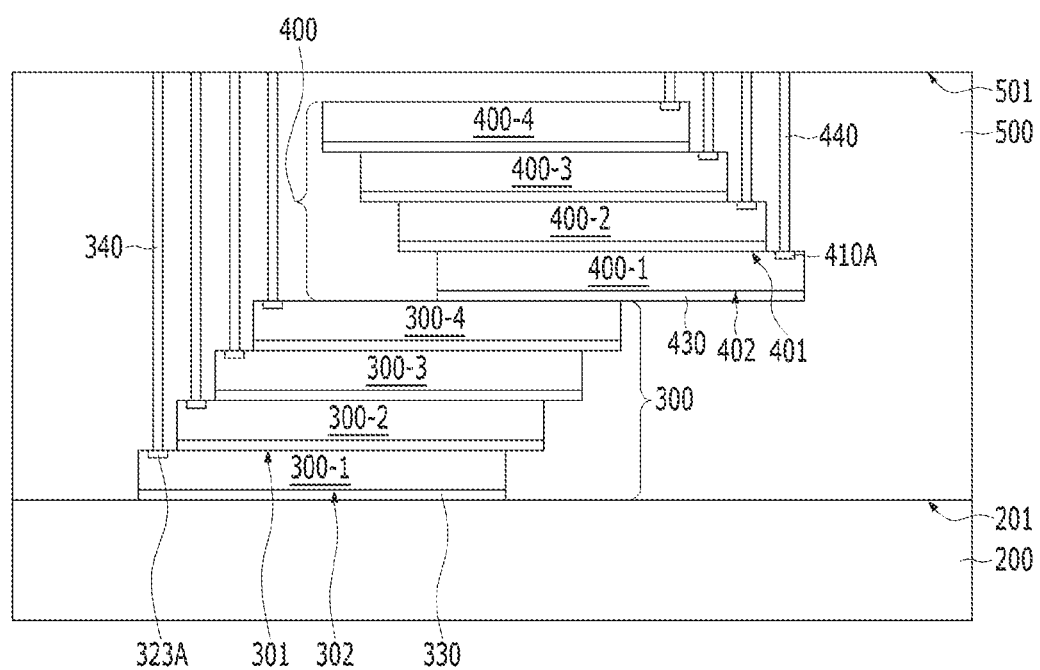
Figure 7:
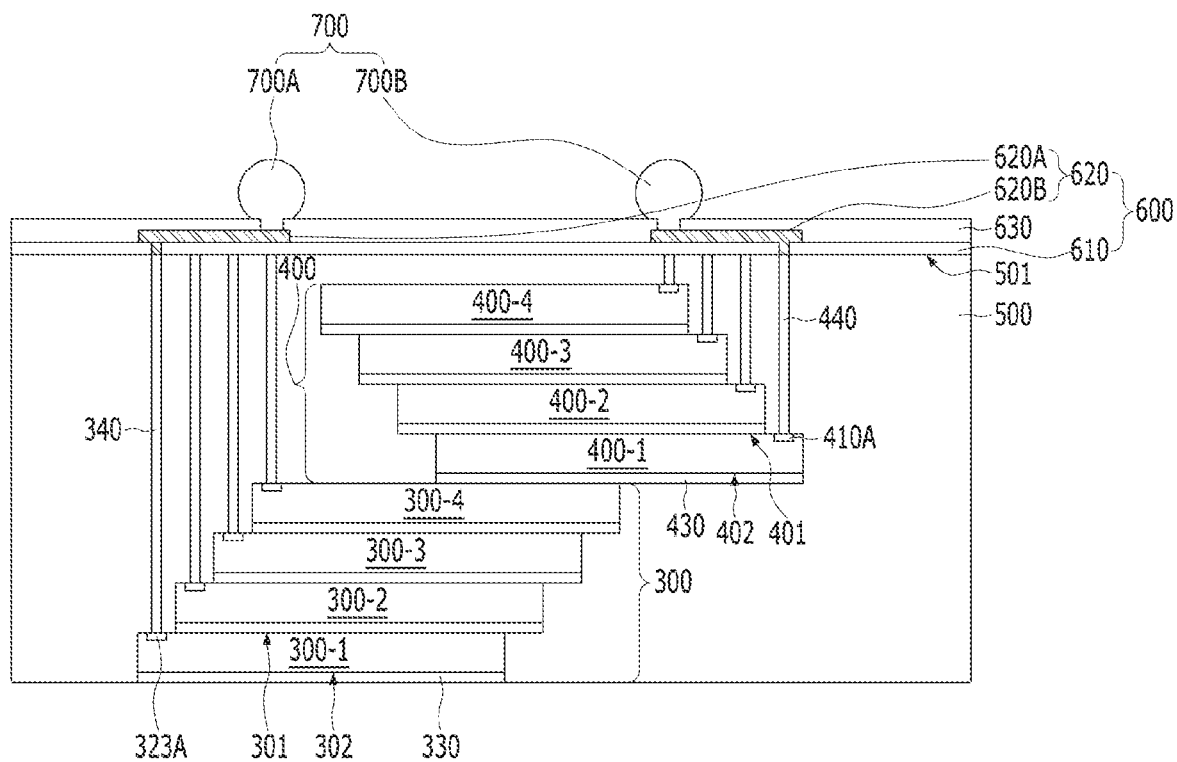

FIGS. 2A, 2B, 3A, 33, 4A, 4B, 5A, 5B, 6, and 7 are diagrams that illustrate a semiconductor package and a method for fabricating the same in accordance with an embodiment. For example, FIGS. 2A, 3A, 4A, and 5A are planar views when the semiconductor package is seen in the direction of the active surface. FIGS. 2B, 3B, 4B, and 5B are cross-sectional views, corresponding to FIGS. 2A to 5B, respectively. In particular, FIGS. 2B to 5B are cross-sectional views that are taken along lines A2-A2' of FIGS. 2A to 5A, respectively. FIGS. 6 and 7 are cross-sectional views that illustrate subsequent processes of a process which is described with reference to FIGS. 5A and 5B. The descriptions of the same components as those described with reference to FIGS. 1A and 1B will be omitted hereafter.

First, the fabrication method will be described.

Figure 2A:
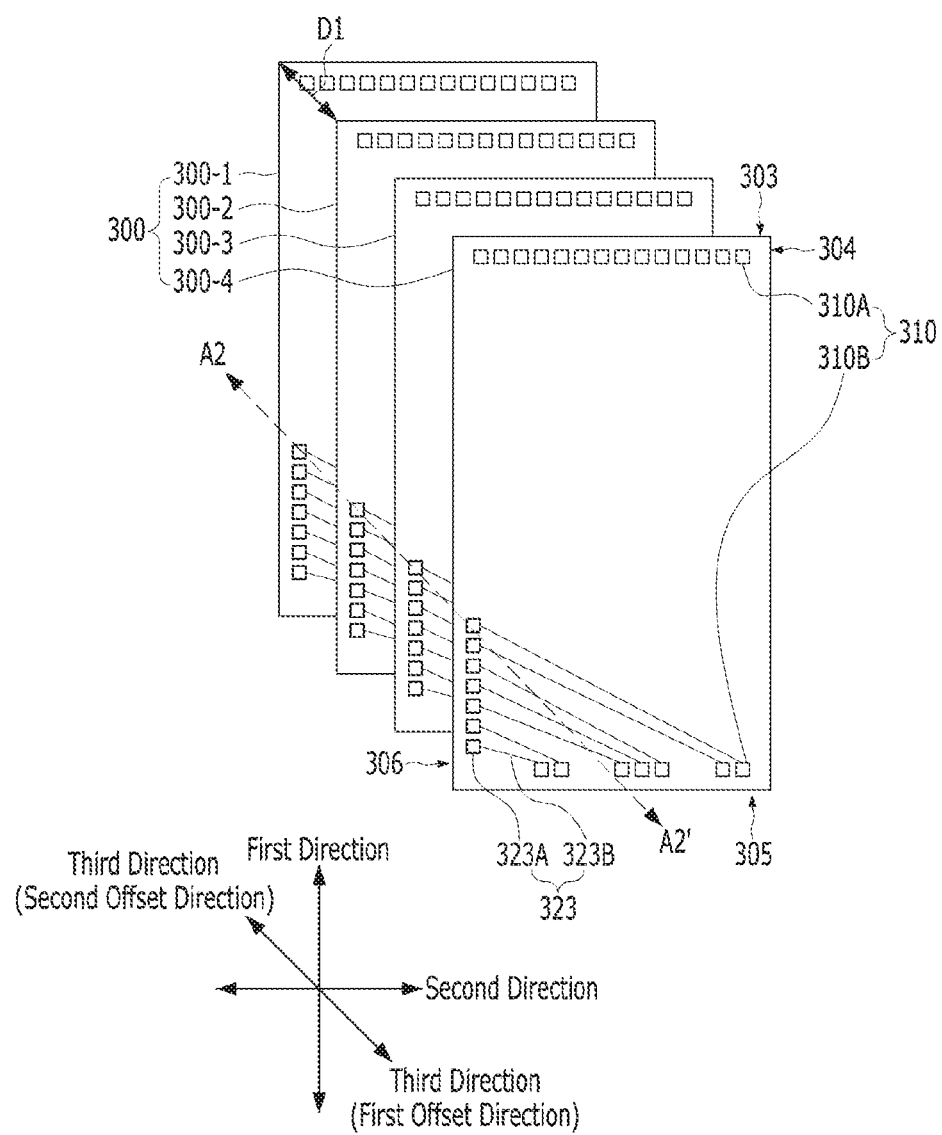
FIGS. 2A, 2B, 3A, 3B, 4A, 4B, 5A, 5B, 6 and 7 are diagrams that illustrate a semiconductor package and a method for fabricating the same in accordance with an embodiment.
Figure 2B:
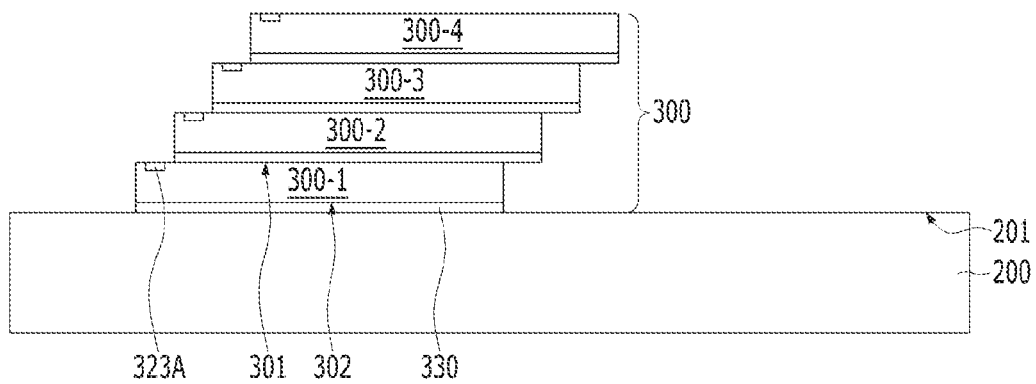

Referring to FIGS. 2A and 2B, a carrier substrate 200 may be provided. The carrier substrate 200 may be a glass carrier substrate, a silicon carrier substrate, a ceramic carrier substrate, or the like. Alternatively, the carrier substrate 200 may be a wafer, and a plurality of packages may be simultaneously formed on the carrier substrate 200.

Then, a first chip stack 300 may be formed on a first surface 201 of the carrier substrate 200. The first chip stack 300 may include a plurality of first semiconductor chips 300-1 to 300-4, stacked in a direction that is perpendicular to the first surface 201 of the carrier substrate 200. In an embodiment, the first chip stack 300 may include four first semiconductor chips 300-1 to 300-4. However, the present embodiments are not limited thereto, and the number of semiconductor chips that are included in the first chip stack 300 may be set to various values, such as, but not limited to 2 and 8. For convenience of description, the four first semiconductor chips are sequentially represented by reference numerals 300-1 to 300-4 in ascending order of distance from the carrier substrate 200.

Each of the first semiconductor chips 300-1 to 300-4 may have substantially the same structure as the semiconductor chip 100, described with reference to FIGS. 1A and 1B. Thus, each of the first semiconductor chips 300-1 to 300-4 may include an active surface 301 on which chip pads 310 and a redistribution conductive layer 323, including redistribution pads 323A and redistribution lines 323B, are disposed. Each of the first semiconductor chips 300-1 to 300-4 may also include an inactive surface 302 that is positioned in the opposite side of the active surface 301. Furthermore, each of the first semiconductor chips 300-1 to 300-4 may include first to fourth side surfaces 303, 304, 305, and 306 connecting the active surface 301 and the inactive surface 302. For reference, FIG. 2B is a cross-sectional view taken along the line A2-A2' of FIG. 2A, and the chip pads 310 might not be seen on this cross-sectional view. For convenience of description, illustration of the redistribution lines 323B and the redistribution dielectric layer is omitted from the cross-sectional view of FIG. 2B. However, each of the first semiconductor chips 300-1 to 300-4 may include the same redistribution layer as the chip redistribution layer 120, described with reference to the cross-sectional view of FIG. 1B. Each of the first semiconductor chips 300-1 to 300-4 may be the same memory chips, for example, the same mobile DRAM chips.

The plurality of first semiconductor chips 300-1 to 300-4 may be stacked on the carrier substrate 200 in such a manner that the inactive surface 302 faces the carrier substrate 200, and the active surface 301 is located on the opposite side of the inactive surface 302. That is, the plurality of first semiconductor chips 300-1 to 300-4 may be stacked in a face-up manner. The inactive surface 302 of each of the first semiconductor chips 300-1 to 300-4 may have an adhesive layer 330 formed thereon. Through the adhesive layer 330, each of the first semiconductor chips 300-1 to 300-4 may be attached to the first semiconductor chip that is located immediately thereunder or the first surface 201 of the carrier substrate 200. The adhesive layer 330 may include a dielectric adhesive material such as a die attach film (DAF).

The plurality of first semiconductor chips 300-1 to 300-4 may be stacked in such a way that the one-side chip pads 310A and the redistribution pads 323A of each of the first semiconductor chips 300-1 to 300-4 are all exposed. For example, any one of the first semiconductor chips 300-1 to 300-4 may be stacked with a constant offset from another first semiconductor chip, which is adjacent in the stacking direction, in a predetermined direction that is parallel to the first surface 201 of the carrier substrate 200. The predetermined direction may indicate a direction away from a first side surface 303, close to the one-side chip pads 310A, and a fourth side surface 306, close to the redistribution pads 323A, among third directions crossing the first and second directions. The predetermined direction will be hereafter referred to as a first offset direction. Hereafter, the offset between the first semiconductor chips 300-1 to 300-4, each being adjacent to one another, will be referred to as a first offset D1. The first offset D1 may be constant or might not be constant. However, the first offset D1 needs to have a value capable of exposing at least the one-side chip pads 310A and the redistribution pads 323A. The cross-sectional view of FIG. 2B, taken in the third direction, illustrates the first chip stack 300 having a stair shape from this perspective.

As the first semiconductor chips are offset-stacked, the one-side chip pads 310A and the redistribution pads 323A, disposed on the lowermost first semiconductor chip 300-1, might not be covered by the other first semiconductor chips 300-2 to 300-4. Instead, the one-side chip pads 310A and the redistribution pads 323A of the first semiconductor chip 300-1 may be exposed. Similarly, the one-side chip pads 310A and the redistribution pads 323A, disposed on the first semiconductor chip 300-2, might not be covered by the first semiconductor chips 300-3 and 300-4, which is located over the first semiconductor chip 300-2. Instead, the one-side chip pads 310A and the redistribution pads 323A of the first semiconductor chip 300-2 may be exposed. The one-side chip pads 310A and the redistribution pads 323A, disposed on the first semiconductor chip 300-3, might not be covered by the first semiconductor chip 300-4 located on the first semiconductor chip 300-3. Instead, the one-side chip pads 310A and the redistribution pads 323A of the first semiconductor chip 300-3 may be exposed. Since the uppermost first semiconductor chip 300-4 is located at the uppermost portion of the first chip stack 300, the uppermost first semiconductor chip 300-4 may be always exposed, regardless of the stack structure, if the semiconductor package includes only the first chip stack 300. In this case, the redistribution pads 323A and the redistribution lines 323B of the uppermost first semiconductor chip 300-4 may be omitted. As will be described below, however, when another semiconductor chip, for example, a second semiconductor chip 400-1 of FIGS. 3A and 3B is located on the first semiconductor chip 300-4, the first semiconductor chip 300-4 may include the redistribution pads 323A and the redistribution lines 323B like the other first semiconductor chips 300-1 to 300-3.

Figure 3A:
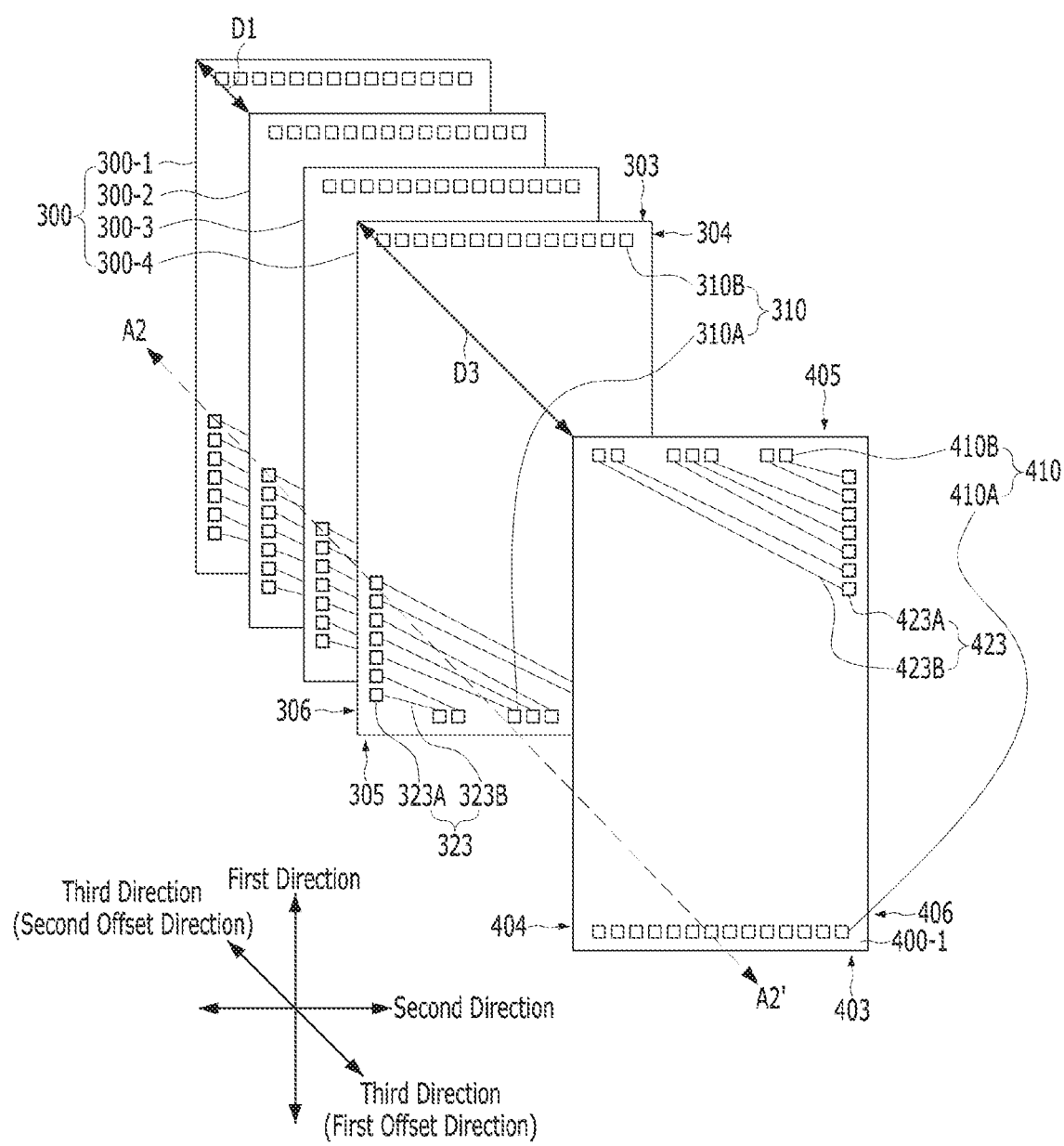
Figure 3B:
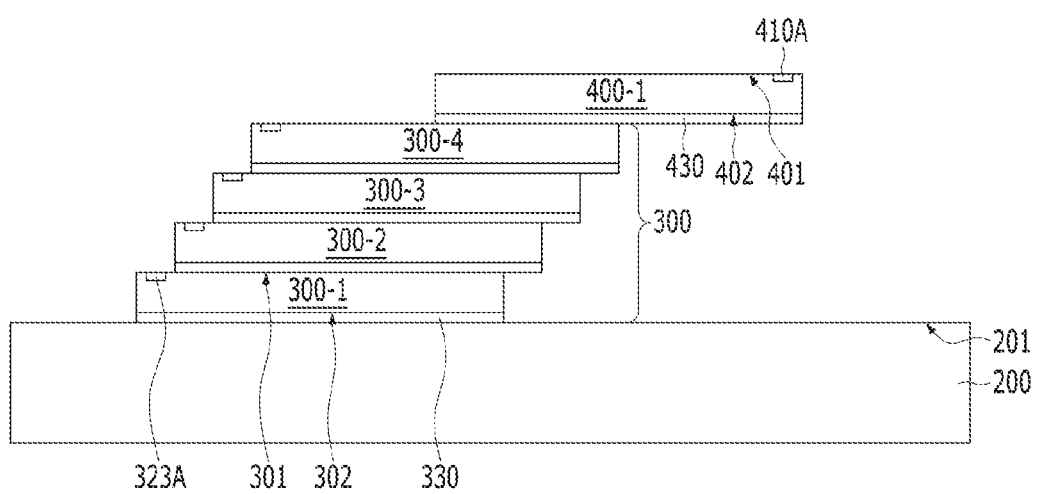

Referring to FIGS. 3A, 3B, 4A, and 4B, a second chip stack 400 may be formed on the first chip stack 300. In accordance with the embodiment, FIGS. 3A and 3B illustrate only the second semiconductor chip 400-1, which is located at the lowermost portion of the second semiconductor chips 400-1 to 400-4 that are included in the second chip stack 400. FIGS. 4A and 4B illustrate the entire second chip stack 400, including the second semiconductor chips 400-1 to 400-4.

The second chip stack 400 may include the plurality of second semiconductor chips 400-1 to 400-4, stacked in the vertical direction. The number of the second semiconductor chips 400-1 to 400-4 that are included in the second chip stack 400 may be set to four, which is equal to the number of the first semiconductor chips 300-1 to 300-4 that are included in the first chip stack 300. However, the present embodiments are not limited thereto, and the number of the semiconductor chips that are included in the second chip stack 400 may be set to various values, such as, but not limited to, 2 and 8. Furthermore, the number of the semiconductor chips that are included in the second chip stack 400 may be different from the number of the semiconductor chips included in the first chip stack 300. For convenience of description, the four second semiconductor chips are sequentially represented by reference numerals 400-1 to 400-4 in ascending order of distance from the carrier substrate 200.

Each of the second semiconductor chips 400-1 to 400-4 may have substantially the same structure as the semiconductor chip 100 of FIGS. 1A and 1B and/or each of the first semiconductor chips 300-1 to 300-4. Thus, each of the second semiconductor chips 400-1 to 400-4 may include an active surface 401 on which chip pads 410 and redistribution conductive layer 423, the redistribution conductive layer 423 including redistribution pads 423A and redistribution lines 423B, are disposed. Each of the second semiconductor chips 400-1 to 400-4 may also include an inactive surface 402 that is located on the opposite side of the active surface 401 and first to fourth side surfaces 403 to 406 that connect the active surface 401 and the inactive surface 402.

However, each of the second semiconductor chips 400-1 to 400-4 may be offset-stacked in the opposite direction compared to the first semiconductor chips 300-1 to 300-4. Each of the second semiconductor chips 400-1 to 400-4 may be formed by rotating the semiconductor chip 100 180 degrees about an axis in a direction that is parallel to the side surfaces 103 to 106 of the semiconductor chip 100, i.e. a direction passing through the active surface 101 and the inactive surface 102. Therefore, the first to fourth side surfaces 403 to 406 of each of the second semiconductor chips 400-1 to 400-4 may be located at the opposite positions of the positions of the first to fourth side surfaces 303 to 306 of each of the first semiconductor chips 300-1 to 300-4, respectively. That is, under the supposition that the first to fourth side surfaces 303 to 306 of each of the first semiconductor chips 300-1 to 300-4 are located on the top, right, bottom and left sides in a planar view, respectively, the first to fourth side surfaces 403 to 406 of each of the second semiconductor chips 400-1 to 400-4 may be located on the bottom, left, top, and right sides in a planar view, respectively. Furthermore, the chip pads 410 and the redistribution conductive layers 423 of the second semiconductor chips 400-1 to 400-4 may also be located at the opposite positions of the positions of the chip pads 310 and the redistribution conductive layers 323 of the first semiconductor chips 300-1 to 300-4. That is, under the supposition that the one-side chip pads 310A and the other-side chip pads 310B of the first semiconductor chips 300-1 to 300-4 are located at the top and bottom edge areas in a planar view and the redistribution pads 323A are located close to the bottom side at the left edge area in a planar view, the one-side chip pads 410A and the other-side chip pads 410B of the second semiconductor chips 400-1 to 400-4 may be located at the bottom and top edge areas in a planar view, and the redistribution pads 423A may be located close to the top side at the right edge area in a planar view.

For reference, FIGS. 3B and 4B are cross-sectional views taken along the line A2-A2', similar to FIG. 2B. Unlike the first semiconductor chips 300-1 to 300-4, the one-side chip pads 410A of the second semiconductor chips 400-1 to 400-4 may be seen on the cross-sectional views, and the other-side chip pads 410B and the redistribution pads 423A might not be seen on the cross-sectional views. For convenience of description, the illustration of the redistribution lines 423B and the redistribution dielectric layer is omitted from the cross-sectional views of FIGS. 3B and 4B. However, each of the second semiconductor chips 400-1 to 400-4 may include the same redistribution layer as the chip redistribution layer 120 that was described with reference to the cross-sectional view of FIG. 1B.

Each of the second semiconductor chips 400-1 to 400-4 may be the same memory chips, for example, the same mobile DRAM chips. The second semiconductor chips 400-1 to 400-4 may be the same memory chips as the first semiconductor chips 300-1 to 300-4.

The plurality of second semiconductor chips 400-1 to 400-4 may be stacked on the first chip stack 300 in such a manner that the inactive surface 402 faces the carrier substrate 200, and the active surface 401 is located on the opposite side of the inactive surface 402. That is, the plurality of second semiconductor chips 400-1 to 400-4 may be stacked in a face-up manner. The inactive surface 402 of each of the second semiconductor chips 400-1 to 400-4 may have an adhesive layer 430 formed thereon. Through the adhesive layer 430, each of the second semiconductor chips 400-1 to 400-4 may be attached to the corresponding second semiconductor chip that is located immediately thereunder or the active surface 301 of the uppermost first semiconductor chip 300-4 of the first chip stack 300. The adhesive layer 430 may include a dielectric adhesive material such as a DAF.

The plurality of second semiconductor chips 400-1 to 400-4 may be stacked in such a manner that the one-side chip pads 410A and the redistribution pads 423A of each of the second semiconductor chips 400-1 to 400-4 are all exposed. For example, any one of the second semiconductor chips 400-1 to 400-4 may be stacked with a constant offset from another second semiconductor chip, which is adjacent in the stacking direction, in a predetermined direction that is parallel to the first surface 201 of the carrier substrate 200. The predetermined direction may indicate a direction away from the first side surface 403 that is close to the one-side chip pads 410A and the fourth side surface 406 that is close to the redistribution pads 423A, among the third directions crossing the first and second directions. The predetermined direction will be hereafter referred to as a second offset direction. Since the one-side chip pads 410A and the redistribution pads 423A of the second semiconductor chips 400-1 to 400-4 are located on the opposite side of the one-side chip pads 310A and the redistribution pads 323A of the first semiconductor chips 300-1 to 300-4, respectively, the second offset direction may face the opposite direction of the first offset direction. For example, when the first offset direction faces between the right and bottom sides, the second offset direction may face between the top and left sides while being parallel to the first offset direction. Hereafter, the offset between the second semiconductor chips 400-1 to 400-4, adjacent to each other, will be referred to as a second offset D2. The second offset D2 may be constant or might not be constant. However, the second offset D2 needs to have a value capable of exposing at least the one-side chip pads 410A and the redistribution pads 423A. In an embodiment, the second offset D2 may be equal to the first offset D1. In other embodiments, however, the second offset D2 may be different from the first offset D1. FIG. 4B, which is a cross-sectional view, taken in the third direction, shows the second chip stack 400 with a stair shape that faces the opposite direction of the first chip stack 300.

As the second semiconductor chips are offset-stacked, the one-side chip pads 410A and the redistribution pads 423A, disposed on the lowermost second semiconductor chip 400-1, might not be covered by the other second semiconductor chips 400-2 to 400-4. Instead, the one-side chip pads 410A and the redistribution pads 423A of the second semiconductor chip 400-1 may be exposed. Similarly, the one-side chip pads 410A and the redistribution pads 423A, disposed on the second semiconductor chip 400-2, might not be covered by the second semiconductor chips 400-3 and 400-4, which is located over the second semiconductor chip 400-2. Instead, the one-side chip pads 410A and the redistribution pads 423A of the second semiconductor chip 400-2 may be exposed. The one-side chip pads 410A and the redistribution pads 423A, disposed on the second semiconductor chip 400-3, might not be covered by the first second semiconductor chip 400-4 located on the second semiconductor chip 400-3. Instead, the one-side chip pads 410A and the redistribution pads 423A of the second semiconductor chip 400-3 may be exposed. Since the second semiconductor chip 400-4 is located at the uppermost portion of the second chip stack 400, the redistribution layer including the redistribution pads 423A and the redistribution lines 423B may be omitted from the uppermost second semiconductor chip 400-4 as illustrated in FIG. 4A, when the semiconductor package includes only the first and second chip stacks 300 and 400 and no other electronic elements are disposed on the second chip stack 400. However, when an electronic element (not illustrated), such as another semiconductor chip, is disposed on the second chip stack 400, the uppermost second semiconductor chip 400-4 may include the redistribution pads 423A and the redistribution lines 423B, the same as the other second semiconductor chips 400-1 to 400-3.

One-side chip pads 310A and the redistribution pads 323A of the first semiconductor chips 300-1 to 300-4 may be exposed. That is, one-side chip pads 310A and the redistribution pads 323A of the first semiconductor chips 300-1 to 300-4 may not covered by the second chip stack 400. This is in order to form vertical interconnectors on the one-side chip pads 310A and the redistribution pads 323A, to be extended in the vertical direction. Meanwhile, since the offset stacking direction of the second chip stack 400 is in the opposite direction as opposed to the offset stacking direction of the first chip stack 300, the second chip stack 400 is likely to cover at least some of the one-side chip pads 310A and the redistribution pads 323A of the first semiconductor chips 300-1 to 300-4. In some embodiments, in order to prevent such a risk, a distance D3 between the lowermost second semiconductor chip 400-1 of the second chip stack 400 and the uppermost first semiconductor chip 300-4 of the first chip stack 300 in the third direction may be increased as much as possible. Furthermore, the second offset D2 may be reduced as much as possible.

However, when the distance D3 is excessively increased, the second chip stack 400 might not be reliably supported by the first chip stack 300, resulting in the second chip stack 400 tilting to one side. In order to prevent such a tilt, the distance D3 may be properly adjusted, or a support structure (not illustrated) having substantially the same thickness as the first chip stack 300 may be formed under the second chip stack 400.

In this way, the first and second chip stacks 300 and 400 may be formed in an arrow shape that faces the first offset direction over the carrier substrate 200. In this state, the one-side chip pads 310A and the redistribution pads 323A of the first semiconductor chips 300-1 to 300-4 of the first chip stack 300 may be all exposed, and the one-side chip pads 410A and the redistribution pads 423A of the second semiconductor chips 400-1 to 400-3 of the second chip stack 400 except the uppermost second semiconductor chip 400-4 may be all exposed. Since the entire active surface 401 of the uppermost second semiconductor chip 400-4 is exposed, all of the chip pads 410 may be exposed.

Referring to FIGS. 5A and 5B, first vertical interconnectors 340 may be formed on the one-side chip pads 310A and the redistribution pads 323A of the first semiconductor chips 300-1 to 300-4 and may be extended in the vertical direction, while connected to the one-side chip pads 310A and the redistribution pads 323A, respectively. Second vertical interconnectors 440 may be formed on the one-side chip pads 410A and the redistribution pads 423A of the second semiconductor chips 400-1 to 400-3 and the chip pads 410 of the uppermost second semiconductor chip 400-4 of the second chip stack 400, and extended in the vertical direction while connected to the one-side chip pads 410A, the redistribution pads 423A and the chip pads 410, respectively.

The first and second vertical interconnectors 340 and 440 may be bonding wires, for example. The process of forming the first and second vertical interconnectors 340 and 440 will be briefly described below. First, with regard to the first vertical interconnectors 340 being connected to the one-side chip pads 310A, first end of a wire may be bonded to the one-side chip pad 310A by a wire bonding machine (not illustrated). The wire may include metals, such as gold, silver, copper and platinum, or alloys thereof, which can be welded to the one-side chip pad 310A by ultrasonic energy and/or heat. Then, the second end of the wire may be pulled in the vertical direction away from the carrier substrate 200, for example, from bottom to top by the wire bonding machine. Subsequently, when the second end of the wire is extended to a desired position, the second end of the wire may be cut. In this way, the first vertical interconnector 340 may be formed, which has a first end (for example, a lower end) that is bonded to the one-side chip pad 310A and a second end (for example, an upper end) that is located at a predetermined distance from the first surface 201 of the carrier substrate 200. The predetermined distance may have a larger value than a distance from the first surface 201 of the carrier substrate 200 to the upper surface of the second chip stack 400.

Alternatively, the second vertical interconnector 440, connected to each of the chip pads 410 of the second semiconductor chip 400-4 that is located at the uppermost portion of the second chip stack 400, may be another type of interconnector instead of a bonding wire. For example, the second vertical interconnector 440, connected to each of the chip pads 410 of the second semiconductor chip 400-4, may be various types of bumps, such as a stud bump and a pillar bump. The bumps may include metals such as copper, silver, tin, and lead.

Referring to FIG. 6, a molding layer 500 may be formed on the carrier substrate 200 on which the first and second chip stacks 300 and 400 and the first and second vertical interconnectors 340 and 440 are formed.

The molding layer 500 may be formed through a molding process that involves filling an empty space of a molding die (not illustrated) with a molding material and then curing the molding material. The molding material may include thermosetting resin, for example, epoxy mold compound (EMC).

The molding layer 500 may be formed to expose the second ends of the first and second vertical interconnectors 340 and 440, for example, the upper ends, while covering the first and second chip stacks 300 and 400 and the first and second vertical interconnectors 340 and 440. For this structure, after the molding layer 500 is formed to such a thickness that covers the first and second chip stacks 300 and 400 and the first and second vertical interconnectors 340 and 440, a grinding process may be performed on the molding layer 500. The grinding process may include a mechanical or chemical polishing process. Alternatively, by adjusting the shapes of the first and second vertical interconnectors 340 and 440 and/or the shape of the molding die without the grinding process, the second ends of the first and second vertical interconnectors 340 and 440 may be exposed.

Thus, the molding layer 500 may have a first surface 501 that is formed at substantially the same level as the second ends of the first and second vertical interconnectors 340 and 440, and the second ends of the first and second vertical interconnectors 340 and 440 may be exposed through the first surface 501.

Referring to FIG. 7, a package redistribution layer 600 may be formed on the first surface 501 of the molding layer 500. In order to distinguish from the redistribution layers 120, 323, and 423, formed in the above-described semiconductor chips, the redistribution layer that is formed on the first surface 501 of the molding layer 500 is referred to as the package redistribution layer 600.

The formation process of the package redistribution layer 600 will be described below. First, a first redistribution dielectric layer 610 may be formed on the first surface 501 of the molding layer 500. The first redistribution dielectric layer 610 may be patterned to have openings that expose the second ends of the first and second vertical interconnectors 340 and 440, respectively. Then, a redistribution conductive layer 620 may be formed on the first redistribution dielectric layer 610. The redistribution conductive layer 620 may fill the openings of the first redistribution dielectric layer 610 to be electrically coupled to the second ends of the first and second vertical interconnectors 340 and 440. The redistribution conductive layer 620 may be patterned into various shapes. The redistribution conductive layer 620, connected to the first vertical interconnectors 340, will be referred to as a first redistribution conductive layer 620A, and the redistribution conductive layer 620, connected to the second vertical interconnectors 440, will be referred to as a second redistribution conductive layer 620B. Then, a second redistribution dielectric layer 630 may be formed on the first redistribution dielectric layer 610 and the redistribution conductive layer 620. The second redistribution dielectric layer 630 may be patterned to have openings that expose portions of the redistribution conductive layer 620. For convenience of description, this cross-sectional view only shows two openings of the first redistribution dielectric layer 610, exposing the second end of the first vertical interconnector 340 that is connected to the lowermost first semiconductor chip 300-1 and the second end of the second vertical interconnector 440 that is connected to the lowermost second semiconductor chip 400-1, respectively, and two redistribution conductive layers 620 that fills the two openings. However, the first redistribution dielectric layer 610 may have openings that expose the second ends of the first vertical interconnectors 340, connected to the remaining first semiconductor chips 300-2, 300-3, and 300-4, The second ends of the second vertical interconnectors 440, connected to the remaining second semiconductor chips 400-2, 400-3, and 400-4, and the redistribution conductive layer 620, may fill these openings.

Subsequently, external connection terminals 700 may be formed on the package redistribution layer 600 to be electrically coupled to the redistribution conductive layer 620 through the openings of the second redistribution dielectric layer 630. In an embodiment, solder balls may be used as the external connection terminals 700. However, the present embodiments are not limited thereto, and various types of electrical connectors may be used as the external connection terminals 700. The external connection terminals 700 may include a first external connection terminal 700A that is connected to the first redistribution conductive layer 620A and a second external connection terminal 700B that is connected to the second redistribution conductive layer 620B.

Then, the carrier substrate 200 may be removed. The carrier substrate 200 may be removed at any time after the molding layer 500 is formed.

Through the above-described process, the semiconductor package, illustrated in FIG. 7, may be fabricated.

Referring back to FIG. 5A, with FIG. 7, the semiconductor package may include the first chip stack 300, the first vertical interconnectors 340, the second chip stack 400, and the second vertical interconnectors 440. The first chip stack 300 may include the plurality of first semiconductor chips 300-1 to 300-4, stacked in the vertical direction. The first vertical interconnectors 340 may be electrically coupled to the plurality of first semiconductor chips 300-1 to 300-4, respectively, extending in the vertical direction. The second chip stack 400 may be disposed on the first chip stack 300 and may include the plurality of second semiconductor chips 400-1 to 400-4 that are stacked in the vertical direction. The second vertical interconnectors 440 may be electrically coupled to the plurality of second semiconductor chips 400-1 to 400-4, respectively, extending in the vertical direction.

Each of the first semiconductor chips 300-1 to 300-4 may include the active surface 301, one-side first chip pads 310A, other-side first chip pads 310B, and first redistribution pads 323A. The active surface 301 may be defined by both side surfaces in the first direction and both side surfaces in the second direction. The one-side first chip pads 310A may be disposed at an edge of the active surface 301, which is close to one side surface in the first direction. The other-side first chip pads 310B may be disposed at an edge of the active surface 301, which is close to the other side surface in the first direction. The first redistribution pads 323A may be electrically coupled to the other-side first chip pads 310B and disposed at an edge of the active surface 301, which is close to one side surface between both side surfaces in the second direction.

The plurality of first semiconductor chips 300-1 to 300-4 may be offset-stacked in the third direction crossing the first and second directions, such that the one-side first chip pads 310A and the first redistribution pads 323A are exposed. For example, the plurality of first semiconductor chips 300-1 to 300-4 may be stacked with an offset in a direction away from the one side surface in the first direction and the one side surface in the second direction.

The first vertical interconnectors 340 may have first ends that are connected to the exposed one-side first chip pad 310A and the exposed first redistribution pad 323A.

Each of the second semiconductor chips 400-1 to 400-4 may be stacked and formed by rotating the first semiconductor chips 300-1 to 300-4 180 degrees about an axis that is parallel to the vertical direction. Thus, the second semiconductor chip may include one-side second chip pads 410A, other-side second chip pads 410B and second redistribution pads 423A, which are located at opposite positions of the positions of the one-side first chip pads 310A, the other-side first chip pads 310B and the first redistribution pads 323A. However, since the uppermost second semiconductor chip 400-4 does not need the second redistribution pads 423A, the second redistribution pads 423A may be omitted from the uppermost second semiconductor chip 400-4.

The plurality of second semiconductor chips 400-1 to 400-4 may be offset-stacked in the third direction so that the one-side second chip pads 410A and the second redistribution pads 423A are exposed. For example, the plurality of second semiconductor chips 400-1 to 400-4 may be offset-stacked in the opposite direction of the offset stacking direction of the first semiconductor chips 300-1 to 300-4.

The second vertical interconnector 440 may have first end that is connected to the one-side second chip pad 410A and the second redistribution pad 423A. However, when the second redistribution pads 423A are omitted from the uppermost second semiconductor chip 400-4, the second vertical interconnector 440 that is connected to the uppermost second semiconductor chip 400-4 may have first end that is connected to the one-side second chip pad 410A and the other-side second chip pad 410B.

The semiconductor package may further include the molding layer 500, the package redistribution layer 600, and the external connection terminals 700. The molding layer 500 may cover the first and second chip stacks 300 and 400. The package redistribution layer 600 and the external connection terminals 700 may be formed on the first surface 501 of the molding layer 500. Since the package redistribution layer 600 can be formed in the area that is defined by the molding layer 500, the semiconductor package may be a fan-out semiconductor package.

The first chip stack 300 may be recognized as one semiconductor chip while connected to an external component through the first vertical interconnector 340, the first redistribution conductive layer 620A, and the first external connection terminal 700A, which are connected thereto. The second chip stack 400 may be recognized as another semiconductor chip, different from the first chip stack 300, while connected to an external component through the second vertical interconnector 440, the second redistribution conductive layer 620B, and the second external connection terminal 700B, which are connected thereto. That is, the electrical path through the first chip stack 300, the first vertical interconnector 340, the first redistribution conductive layer 620A, and the first external connection terminal 700A may be electrically isolated from and may be recognized as a separate path from the electrical path through the second chip stack 400, the second vertical interconnector 440, the second redistribution conductive layer 620B, and the second external connection terminal 700B.

Since the components of the semiconductor package have been already described during the description of the fabrication method, the detailed descriptions thereof have been omitted.

The semiconductor package and the method for fabricating the same, which have been described so far, may acquire the following effects.

First, the semiconductor package with the plurality of stacked semiconductor chips can be formed to satisfy high-performance/high-capacity requirements. Furthermore, the fan-out semiconductor package, using the redistribution layer instead of the existing substrate, may be formed through the vertical wires, which makes it possible to implement the semiconductor package with a small thickness.

Furthermore, the semiconductor package and the fabrication method can solve a problem in which it is difficult to stack semiconductor chips while exposing all chip pads disposed at both edges thereof, when the semiconductor chips include the chip pads disposed at both edges thereof. For example, in order to solve the problem, the redistribution layer may be added to the semiconductor chips, and the plurality of semiconductor chips may be offset-stacked in a diagonal direction. In particular, the redistribution layer that is connected only to the chip pads, disposed at one edge of the semiconductor chip between both edges thereof, may be formed. This makes it possible to reduce the process cost or to lower the difficulty level of the process, due to the formation of the redistribution layer.

In an embodiment, the case in which the semiconductor package includes two chip stacks that are stacked in the vertical direction, i.e. the first and second chip stacks 300 and 400, has been described. However, the semiconductor package may include only one of the first and second chip stacks 300 and 400 or more stacks than the first and second chip stacks 300 and 400.

When the semiconductor package includes only one chip stack, the redistribution layer of the uppermost semiconductor chip may be omitted. Thus, the vertical interconnectors that are connected to the uppermost semiconductor chip may be connected to the one-side chip pads and the other-side chip pads, respectively. Furthermore, the vertical interconnectors that are connected to the uppermost semiconductor chip may be conductive bumps, and the vertical interconnectors that are connected to the other semiconductor chips may be bonding wires.

When the semiconductor package includes three or more chip stacks, structures similar to the first and second chip stacks 300 and 400 may be repeatedly stacked over the first and second chip stacks 300 and 400. Among the semiconductor chip stacks, only the redistribution layer of the uppermost semiconductor chip of the uppermost chip stack may be omitted, and the other semiconductor chips may include the redistribution layer. Three or more chip stacks may be stacked while the offset directions thereof are alternately changed to expose all of the one-side chip pads and the redistribution pads of the semiconductor chips, except for the uppermost semiconductor chip.

Since the case in which the semiconductor package includes only one chip stack or three or more chip stacks can be easily derived from the descriptions of the above-described embodiments, the detailed descriptions thereof have been omitted.

In accordance with the present embodiments, it is possible to provide a semiconductor package with a small thickness and with the ability to satisfy high-performance and high-capacity requirements through the method of stacking a plurality of semiconductor chips, each having chip pads that are disposed at both edges thereof.

Meanwhile, when the first and second vertical interconnectors 340 and 440 includes bonding wires in the above semiconductor package, the sweeping of the first and second vertical interconnectors 340 and 440 may occur. This will be described in more detail with reference to FIG. 8.

Figure 8:
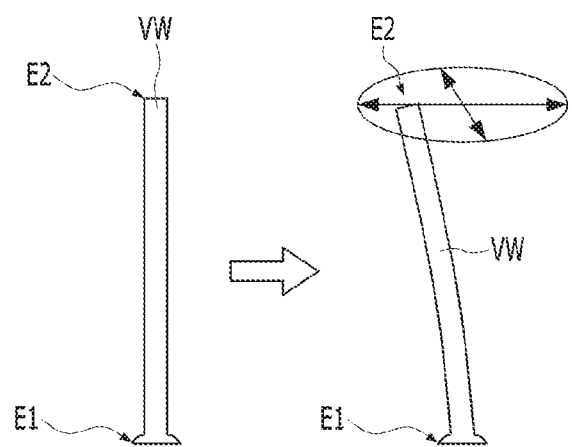
FIG. 8 illustrates sweeping of a vertical wire.

FIG. 8 illustrates the sweeping of a vertical wire.

Referring to FIG. 8, a vertical wire VW may have first end E1 that is attached to a chip pad and the second end E2 that is located on the opposite side thereof.

The left side of an arrow shows a state immediately after the vertical wire VW is formed. In other words, the left side of the arrow shows a state immediately after the wire cutting in a wire bonding process using a wire bonding machine. Such a vertical wire VW may maintain a state of substantially 90 degree verticality as long as no external force is applied.

The right side of the arrow shows a state after an external force, such as pressure, is applied to the vertical wire VW through a flow of a molding material during a molding process. When the pressure is applied, the first end E1 of the vertical wire VW is not moved because the first end E1 is fixed to the chip pad. However, since the second end E2 of the vertical wire VW is not fixed, sweeping may occur. That is, the vertical wire VW may be bent. As a result of the sweeping, the second end E2 of the vertical wire VW may be displaced to a random position within a range of a circle that is illustrated in FIG. 8, for example. The displacement of the second end E2 of the vertical wire VW may be changed by a vortex of the molding material, which is caused by the injection direction and pressure of the molding material and the surrounding structure. The larger the length of the vertical wire VW, the more severe the sweeping. In case of the sweeping of the vertical wire VW, since the position of the second end E2 of the vertical wire VW is changed, a component to be connected to the second end E2 of the vertical wire VW, for example, a redistribution layer, may be misaligned from the second end E2 of the vertical wire VW. Therefore, a connection defect may occur between the vertical wire VW and the redistribution layer.

In other words, when the first and second vertical interconnectors 340 and 440 are bent and the positions of the second ends of the first and second vertical interconnectors 340 and 440 change, the first and second vertical interconnectors 340 and 440 and corresponding openings of the first redistribution dielectric layer 610 and/or corresponding redistribution conductive layers 620 may be misaligned. As a result, a poor connection between the first and second vertical interconnectors 340 and 440 and the corresponding redistribution conductive layers 620 may occur.

In the following embodiments, a semiconductor package that prevents the poor connection between the first and second vertical interconnectors 340 and 440 and the redistribution conductive layers 620 will be described.

Figure 9:
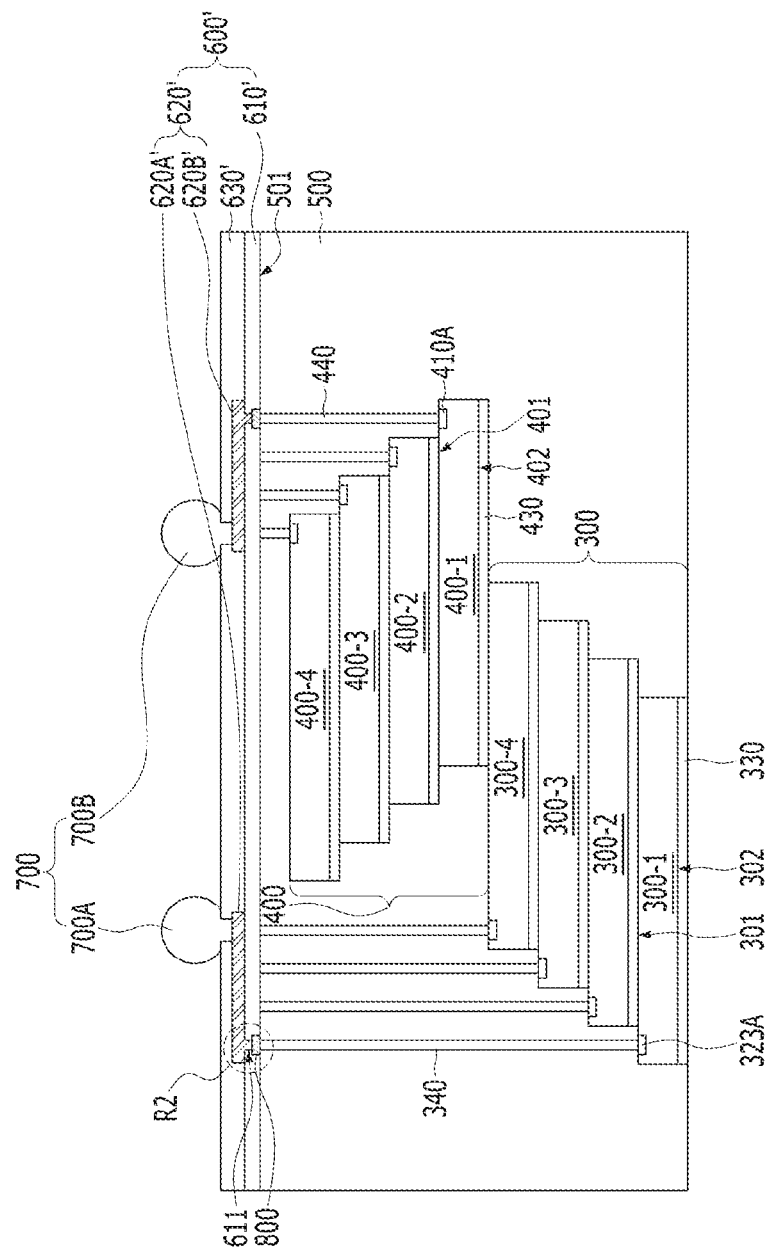
FIG. 9 is a cross-sectional view, illustrating a semiconductor package and a method for fabricating the same, in accordance with another embodiment.
Figure 10A:
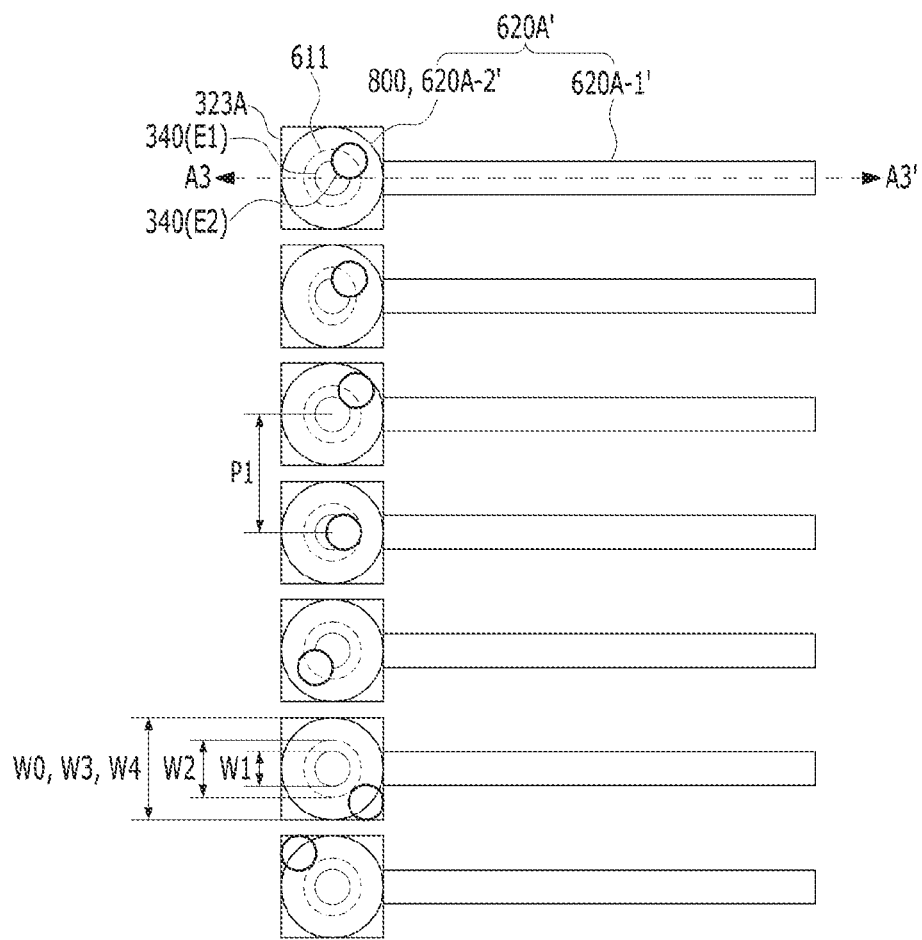
FIG. 10A is an enlarged planar view of a landing pad and a package redistribution layer in the semiconductor package of FIG. 9, based on vertical interconnectors that are connected to a lowermost semiconductor chip of a first chip stack and adjacent to each other.
Figure 10B:
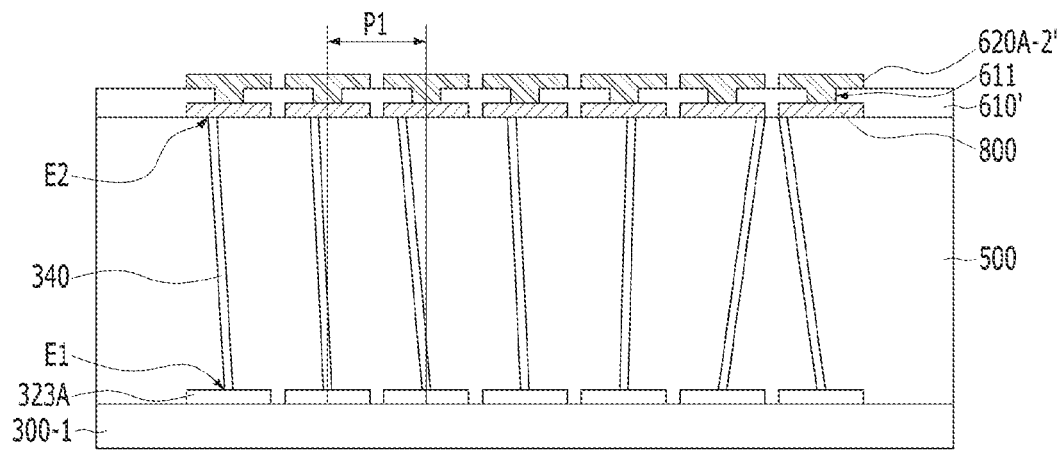
FIG. 10B is a cross-sectional view, corresponding to the planar view of FIG. 10A.
Figure 10C:
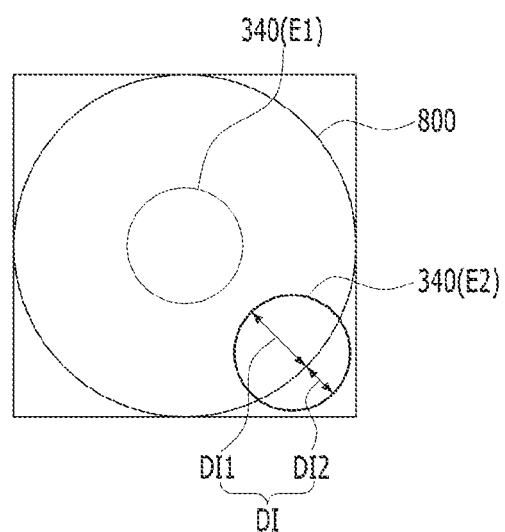
FIG. 10C is an enlarged planar view of a portion of FIG. 10A.

FIG. 9 is a cross-sectional view, illustrating a semiconductor package and a method for fabricating the same, in accordance with another embodiment. FIG. 10A is an enlarged planar view of a landing pad and a package redistribution layer in the semiconductor package of FIG. 9, based on vertical interconnectors that are connected to a lowermost semiconductor chip of a first chip stack and adjacent to each other. FIG. 10B is a cross-sectional view corresponding to the planar view of FIG. 10A. FIG. 10C is an enlarged planar view of a portion of FIG. 10A. More specifically, FIG. 10A is shown based on the vertical interconnectors in the R1 region of FIG. 5A. FIG. 10B is a cross-sectional view from the left side of FIG. 10A. FIG. 10C is an enlarged view of the landing pad positioned at a second position from the bottom and components connected thereto. Detailed descriptions of substantially the same components as those of the above-described embodiment will be omitted.

Referring to FIG. 9, a semiconductor package of the present embodiment may include a first chip stack 300, a second chip stack 400, first vertical interconnectors 340, second vertical interconnectors 440, and a molding layer 500 which are substantially the same as the above-described embodiment.

In addition, the semiconductor package may include landing pads 800 and a package redistribution layer 600' which are disposed on a first surface 501 of the molding layer 500.

The landing pad 800 may be formed on the first surface 501 of the molding layer 500 to overlap each of the first and second vertical interconnectors 340 and 440. In other words, the landing pad 800 may be positioned at each position of the first and second vertical interconnectors 340 and 440, shown in the planar view of FIG. 5A. For convenience of description, only two landing pads 800 are shown in the present cross-sectional view. One of the landing pads 800 is connected to the second end of the first vertical interconnector 340, which is connected to the lowermost first semiconductor chip 300-1, and the other landing pad 800 is connected to the second end of the second vertical interconnector 440, which is connected to the lowermost second semiconductor chip 400-1. The landing pads 800 may be further formed to be connected to the second ends of the first vertical interconnectors 340 of the remaining first semiconductor chips 300-2, 300-3, and 300-4, and the second ends of the second vertical interconnectors 440 of the remaining second semiconductor chips 400-2, 400-3 and 400-4, respectively.

Here, since the second ends of the first and second vertical interconnectors 340 and 440 may be changed in their positions due to sweeping, the landing pads 800 may be arranged to be aligned with the first and second vertical interconnectors 340 and 440 with respect to the first ends of the first and second vertical interconnectors 340 and 440, respectively. As will be described later, the landing pad 800 may have a relatively large planar area and/or diameter. Therefore, even if the positions of the second ends of the first and second vertical interconnectors 340 and 440 are somewhat altered by the sweeping of the first and second vertical interconnectors 340 and 440, the landing pads 800 may stay connected with the second ends of the first and second vertical interconnectors 340 and 440.

The landing pad 800 may include a metal material such as gold, aluminum, copper, titanium, tungsten, or other conductive material. The landing pad 800 may provide an electrical connection between the first and second vertical interconnectors 340 and 440 and the package redistribution layer 600'. The landing pad 800 may be formed by plating or the like.

The package redistribution layer 600' may be formed on the first surface 501 of the molding layer 500 in which the landing pad 800 is formed. The package redistribution layer 600' may include the first redistribution dielectric layer 610', the redistribution conductive layer 620', and the second redistribution dielectric layer 630'. The package redistribution layer 600' may be substantially the same as the package redistribution layer 600 of the above-described embodiment except that the first redistribution dielectric layer 610' has a thickness that covers the top and side surfaces of the landing pad 800. The package redistribution layer 600' may further have an opening 611 that exposes each of the upper surfaces of the landing pads 800, and the redistribution conductive layer 620' may contact the upper surface of the landing pad 800 through the opening 611. The redistribution conductive layer 620' electrically connected to the first vertical interconnector 340 through the landing pad 800, will be referred to as a first redistribution conductive layer 620A'. Furthermore, the redistribution conductive layer 620' electrically connected to the second vertical interconnector 440 through the landing pad 800, will be referred to as a second redistribution conductive layer 620B'. Similar to the above-described embodiment, for convenience of description, only two redistribution conductive layers 620', connected to the landing pads 800, are shown in this cross-sectional view. However, other redistribution conductive layers may be formed to be connected to the second ends of the first vertical interconnectors 340 and the second ends of the second vertical interconnectors 440 through the landing pads 800. For example, redistribution conductive layers may be formed to be connected to the remaining first semiconductor chips 300-2, 300-3, and 300-4 through the first vertical interconnectors 340, moreover, redistribution conductive layers may be formed to be connected to the remaining second semiconductor chips 400-2, 400-3, and 400-4 through the second vertical interconnectors 440.

FIGS. 10A to 10C will detail the method of forming and aligning the first and second vertical interconnectors 340 and 440, the landing pads 800, and the redistribution conductive layers 620' in a planar view.

FIGS. 10A and 10B shows the first vertical interconnectors 340 in the region R1 of FIG. 5A, that is, the first vertical interconnectors 340 with first ends E1 respectively connected to the redistribution pads 323A of the lowermost first semiconductor chip 300-1, the landing pads 800 respectively connected to the second ends E2 of the first vertical interconnectors 340, and the first redistribution conductive layers 620A' respectively connected to the landing pads 800. For convenience of description, a line portion 620A-1' of the first redistribution conductive layer 620A' is expressed in a shape that extends in a right direction in this figure.

Among the first vertical interconnectors 340, the first vertical interconnector 340 on the line A3-A3' of FIG. 10A, the redistribution pad 323A that is connected to the first end E1 of the first vertical interconnector 340, and the landing pad 800 that is connected to the second end E2 of the first vertical interconnector 340 and the first redistribution conductive layer 620A' may be shown in FIG. 9. In other words, the leftmost first vertical interconnector 340, and the redistribution pad 323A, the landing pad 800, and the first redistribution conductive layer 620A' connected thereto may correspond to components that are shown in the cross-section along the line A3-A3' of FIG. 10A. On the other hand, the remaining first vertical interconnectors 340 are not shown in the cross-sectional view of FIG. 9, but may be arranged in a direction penetrating the cross-sectional view of FIG. 9.

The redistribution pad 323A may have a planar rectangular shape. However, the present embodiments are not limited thereto, and a planar shape of the redistribution pad 323A may be modified in various manners. The width of the redistribution pad 323A is denoted by W0 in a planar view.

The first vertical interconnector 340 may have a planar circular shape. However, the present embodiments are not limited thereto, and a planar shape of the first vertical interconnector 340 may be modified in various manners. The planar width and/or diameter of the first vertical interconnector 340 will be referred to as a first width W1 hereinafter. The first end E1 of the first vertical interconnector 340 may be attached and/or bonded to the redistribution pad 323A to fix its position. The first vertical interconnector 340 may overlap and/or be aligned with the redistribution pad 323A so that the center of the first end E1 of the first vertical interconnector 340 and the center of the redistribution pad 323A coincide with each other. On the other hand, the second end E2 of the first vertical interconnector 340 may have a variable position as described with reference to FIG. 8. In other words, the center of the second end E2 of the first vertical interconnector 340 may be spaced a predetermined distance from the center of the first end E1 of the first vertical interconnector 340 and/or the center of the redistribution pad 323A. FIGS. 10A and 10B illustrate various examples of varying positions of the second ends E2 of the first vertical interconnectors 340.

The landing pad 800 may overlap and/or be aligned with the first vertical interconnector 340 on the first vertical interconnector 340. In particular, the landing pad 800 may overlap and/or be aligned with the first vertical interconnector 340 so that its center coincides with the center of the first end E1 of the first vertical interconnector 340. Although the landing pad 800 is illustrated as having a planar circular shape, the present embodiments are not limited thereto, and the planar shape of the landing pad 800 may be variously modified. The planar width and/or diameter of the landing pad 800 will be referred to as a fourth width W4 hereinafter.

The first redistribution conductive layer 620A' may have a line portion 620A-1' and a pad portion 620A-2'. The line portion 620A-1' may have a relatively narrow width and extends in one direction or bent in various directions, and the pad portion 620A-2' may have a relatively larger width than the line portion 620A-1' to provide an easy connection with the landing pad 800. The pad portion 620A-2' of the first redistribution conductive layer 620A' may overlap and/or be aligned with the landing pad 800 on the landing pad 800. In particular, the pad portion 620A-2' may overlap and/or be aligned with the landing pad 800 such that its center coincides with the center of the landing pad 800. Although the pad portion 620A-2' is illustrated as having a planar circular shape, the present embodiments are not limited thereto, and the planar shape of the pad portion 620A-2' may be variously modified. The planar width or diameter of the pad portion 620A-2' will be referred to as a third width W3 hereinafter.

The pad portion 620A-2' may be connected to the landing pad 800 through the opening 611 of the first redistribution dielectric layer (see 610' of FIG. 9). The opening 611 may also overlap and/or be aligned with the pad portion 620A-2' and the landing pad 800, respectively. In particular, the center of the opening 611 may coincide with the center of the pad portion 620A-2' and the center of the landing pad 800. Although the opening 611 is illustrated as having a planar circular shape, the present embodiments are not limited thereto, and the planar shape of the opening 611 may be variously modified. The planar width and/or diameter of the opening 611 will be referred to as a second width W2 hereinafter.

In summary, the redistribution pad 323A, the first end E1 of the first vertical interconnector 340, the opening 611 of the first redistribution dielectric layer (see 610' in FIG. 9), the pad portion 620A-2' of the first redistribution conductive layer 620A', and the landing pad 800 may overlap and/or be aligned with each other so that the centers thereof substantially coincide with each other. However, in other embodiments, these centers may be slightly displaced due to process problems or the like.

Although the centers of the redistribution pad 323A, the first end E1 of the first vertical interconnector 340, the opening 611 of the first redistribution dielectric layer (see 610' in FIG. 9), the pad portion 620A-2' of the first redistribution conductive layer 620A', and the landing pad 800 are substantially aligned with each other or slightly shifted from each other, they may be arranged to have the same pitch so that an electrical connection therebetween may be made. That is, when the distance between the centers of the redistribution pads 323A that are adjacent to each other is referred to as a first pitch P1, the distance between the centers of the first ends E1 of the first vertical interconnectors 340 that are adjacent to each other, the distance between the centers of the openings 611 that are adjacent to each other, the distance between the centers of the pad portions 620A-2' that are adjacent to each other, and the distance between the centers of the landing pads 800 that are adjacent to each other may be substantially the same as the first pitch P1.

Here, the first width W1 of the first vertical interconnector 340 may be the smallest, and the fourth width W4 of the landing pad 800 and the third width W3 of the pad portion 620A-2' may be larger than the first width W1, and the second width W2 of the opening 611 may be larger than the first width W1 while being smaller than the fourth width W4 and the third width W3. The third width W3 and the fourth width W4 may be the same as or similar to each other. The first width W1 may be several to several tens of micrometers. When the first width W1, that is, the thickness of the first vertical interconnector 340 is too small, it may be difficult to form a stable loop when forming the first vertical interconnector 340. In other words, it may be difficult to fabricate the first vertical interconnector 340 to be constantly formed in the vertical direction. In addition, since the displacement of the second end E2 of the first vertical interconnector 340 is excessively large due to a large influence from a flow of a molding material, it may be difficult to connect the landing pad 800 to the first vertical interconnector 340. On the other hand, when the first width W1 has an excessively large value, it may be difficult to form a loop with a wire bonding apparatus using a bonding capillary. The fourth width W4 may be determined in consideration of the displacement of the second end E2 of the first vertical interconnector 340 and the distance between the landing pads 800. More specifically, if the fourth width W4 is too small, the connection between the first vertical interconnector 340 and the landing pad 800 may be difficult. On the other hand, if the fourth width W4 is too large, an electrical short between the adjacent landing pads 800 may occur. In order to solve these problems, the lower limit and the upper limit of the fourth width W4 must be appropriately adjusted. For example, the fourth width W4 may have a value equal to or greater than the width W0 and/or a length of a side of the chip pad (not shown) or the redistribution pad 323A, and less than the first pitch P1. Furthermore, the fourth width W4 may have a value of 2 to 3 times the first width W1. The third width W3 may be the same as or similar to the fourth width W4. The second width W2 may have a value between the third and fourth widths W3 and W4 and the first width W1. For example, the second width W2 may have a value of 1.2 to 1.8 times the first width W1.

Meanwhile, a whole of the second end E2 of the first vertical interconnector 340 may contact the lower surface of the landing pad 800. Alternatively, when the displacement of the second end E2 of the first vertical interconnector 340 is large, a portion of the second end E2 of the first vertical interconnector 340 may contact the landing pad 800. However, even in such a case, the area of the portion of the second end E2 of the first vertical interconnector 340 which is in contact with the landing pad 800 may be more than a predetermined level to electrically connect the landing pad 800 and the first vertical interconnector 340 sufficiently. For example, as shown in FIG. 10C, when a portion (see DI1) of the second end E2 of the first vertical interconnector 340 contacts the landing pad 800 while a remaining portion (see DI2) does not overlap the landing pad 800, the diameter DI1 of the portion of the second end E2 may have a value equal to or greater than ⅔ of a total diameter DI to meet the requirements for the electrical connection between the landing pad 800 and the first vertical interconnector 340.

According to the semiconductor package and the method for fabricating the same described above, even if the sweeping of a vertical interconnector occurs, a redistribution conductive layer and the vertical interconnector may be easily connected to each other by placing a relatively large landing pad between the redistribution conductive layer and the vertical interconnector.

Meanwhile, FIGS. 9 and 10A to 10C illustrate the connection and arrangement of the vertical interconnector, the landing pad, and the redistribution conductive layer in the semiconductor package of FIGS. 2A to 7. However, instead of the semiconductor package of FIGS. 2A to 7, the present embodiments may also be applied to other fan-out semiconductor packages that use vertical interconnectors. This will be described by way of example with reference to FIGS. 11A to 12B below.

Figure 11A:
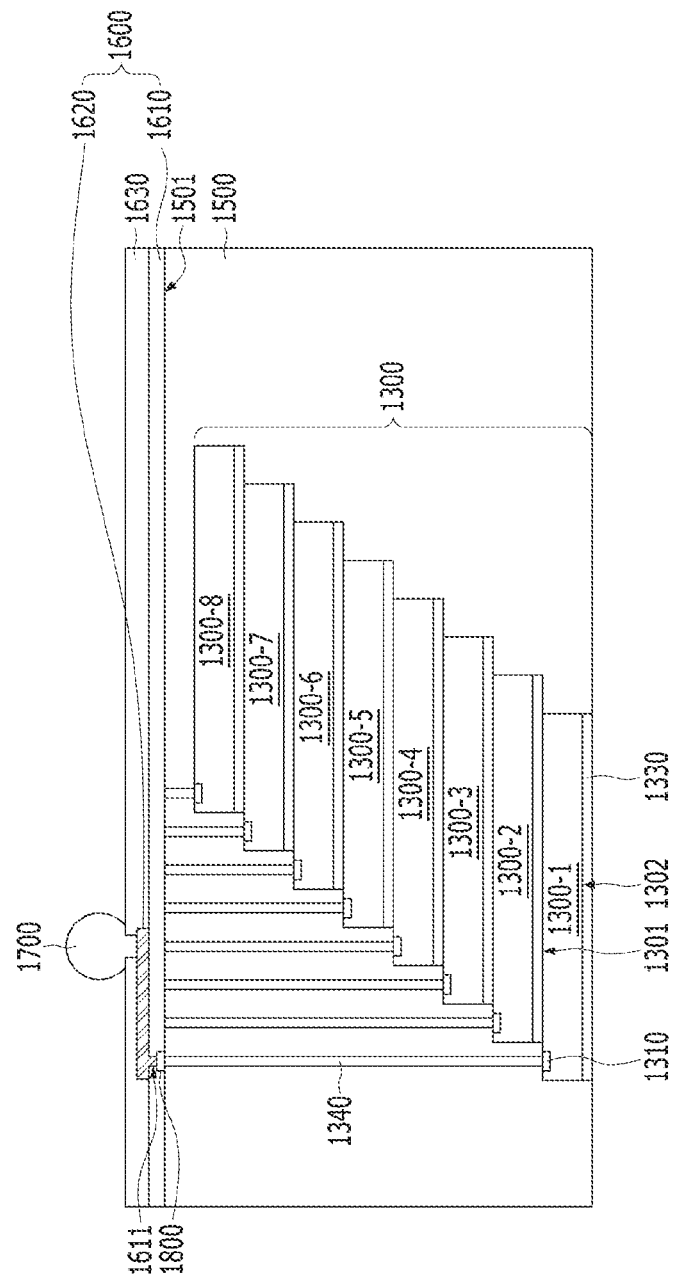
FIG. 11A is a cross-sectional view, illustrating a semiconductor package, in accordance with another embodiment.
Figure 11B:
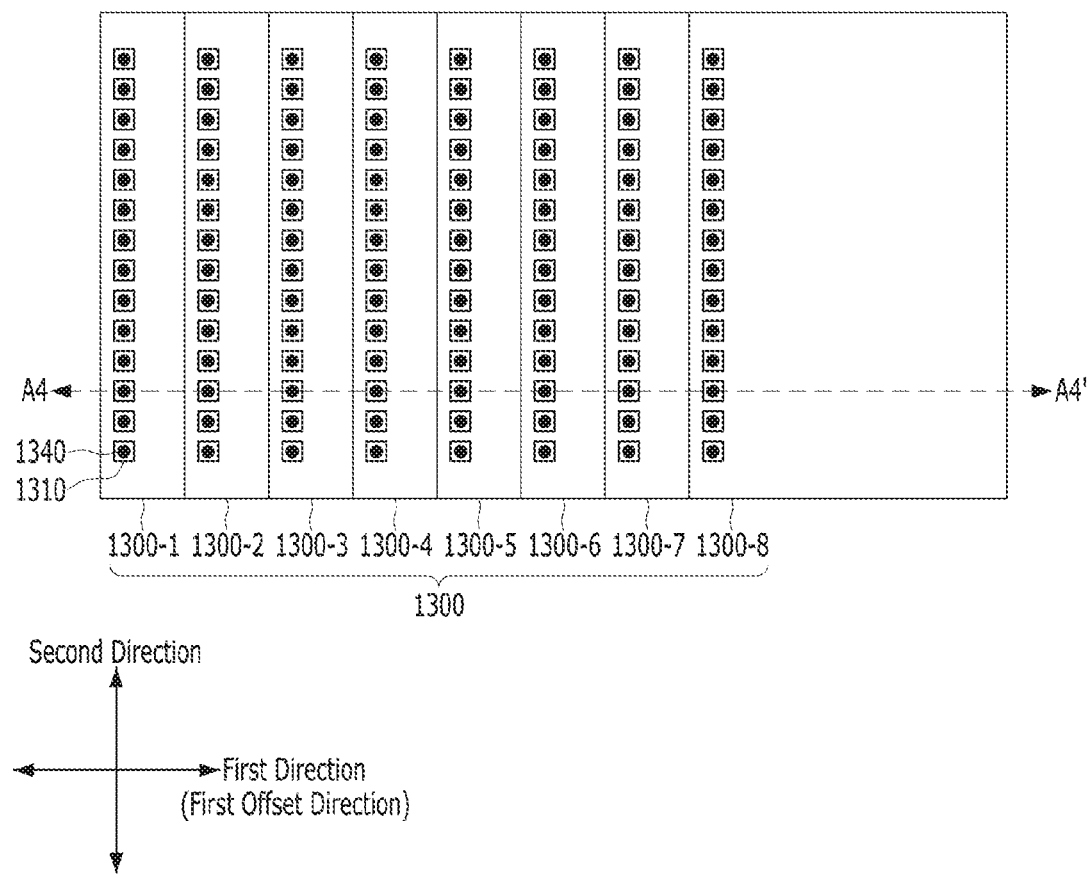
FIG. 11B is a planar view that shows a chip stack and vertical interconnectors of the semiconductor package of FIG. 11A.

FIG. 11A is a cross-sectional view illustrating a semiconductor package in accordance with another embodiment, and FIG. 11B is a planar view showing a chip stack and vertical interconnectors of the semiconductor package of FIG. 11A. FIG. 11A may include a cross-sectional view taken along a line A4-A4' of FIG. 11B.

Referring to FIGS. 11A and 11B, a semiconductor package may include a chip stack 1300 with a plurality of semiconductor chips 1300-1 to 1300-8, stacked in a substantially vertical direction. In this embodiment, the chip stack 1300 includes eight semiconductor chips 1300-1 to 1300-8. However, the present disclosure is not limited thereto, and the number of semiconductor chips included in the chip stack 1300 may vary.

Each of the semiconductor chips 1300-1 to 1300-8 may include an active surface 1301 on which chip pads 1310 are disposed, and an inactive surface 1302 that is disposed on the opposite side of the active surface 1301. The chip pads 1310 may be disposed at one of two edge regions of the first direction of the active surface 1301, for example, at the left side. In addition, the chip pads 1310 may be arranged in a line in the second direction. However, the present disclosure is not limited thereto, and the arrangement of the chip pads 1310 may vary as long as the chip pads 1310 are disposed in any one of two edge regions of the first direction. An adhesive layer 1330 may be formed on the inactive surface 1302 of each of the semiconductor chips 1300-1 to 1300-8.

Each of the semiconductor chips 1300-1 to 1300-8 may be the same memory chips, for example, NAND flash memory chips. However, the present disclosure is not limited thereto, and the semiconductor chips 1300-1 to 1300-8 may include different memory chips.

The semiconductor chips 1300-1 to 1300-8 may be stacked in a face-up manner in which the active surfaces 1301 face upward. In this case, the semiconductor chips 1300-1 to 1300-8 may be offset-stacked in a first offset direction from one side of the first direction, adjacent to the chip pads 1310, toward the other side that is located opposite to the one side so that all the chip pads 1310 of the semiconductor chips 1300-1 to 1300-8 are exposed. Both sidewalk of the semiconductor chips 1300-1 to 1300-8 in the second direction may be aligned with each other.

A vertical interconnector 1340 may extend in the substantially vertical direction with the first end that is connected to the respective exposed chip pads 1310 based on the offset-stacking. The vertical interconnector 1340 may be a bonding wire. Alternatively, the vertical interconnector 1340, connected to the uppermost semiconductor chip 1300-8 of a plurality of vertical interconnectors 1340, may be a conductive bump, and the remaining vertical interconnectors 1340 may be a bonding wire.

A molding layer 1500 may be formed to cover the chip stack 1300 and the vertical interconnectors 1340 while having a first surface 1501 that exposes the second ends of the vertical interconnectors 1340.

A landing pad 1800 may be formed to be in contact with the second end of each of the vertical interconnectors 1340 by being aligned with each of the vertical interconnectors 1340 on the first surface 1501 of the molding layer 1500.

A package redistribution layer 1600 may include a first redistribution dielectric layer 1610 covering the first surface 1501 of the molding layer 1500 and the landing pad 1800, a redistribution conductive layer 1620 formed on the first redistribution dielectric layer 1610 and connected to the landing pad 1800 through an opening 1611 of the first redistribution dielectric layer 1610, and a second redistribution dielectric layer 1630 that covers the first redistribution dielectric layer 1610 and the redistribution conductive layer 1620.

The arrangement of the landing pads 1800, the openings 1611 of the first redistribution dielectric layers 1610, and the redistribution conductive layer 1620 may be substantially the same as those described with reference to FIGS. 10A to 10C. Therefore, detailed description thereof will be omitted.

An external connection terminal 1700 may be connected to the redistribution conductive layer 1620 through an opening formed in the second redistribution dielectric layer 1630.

Figure 12A:
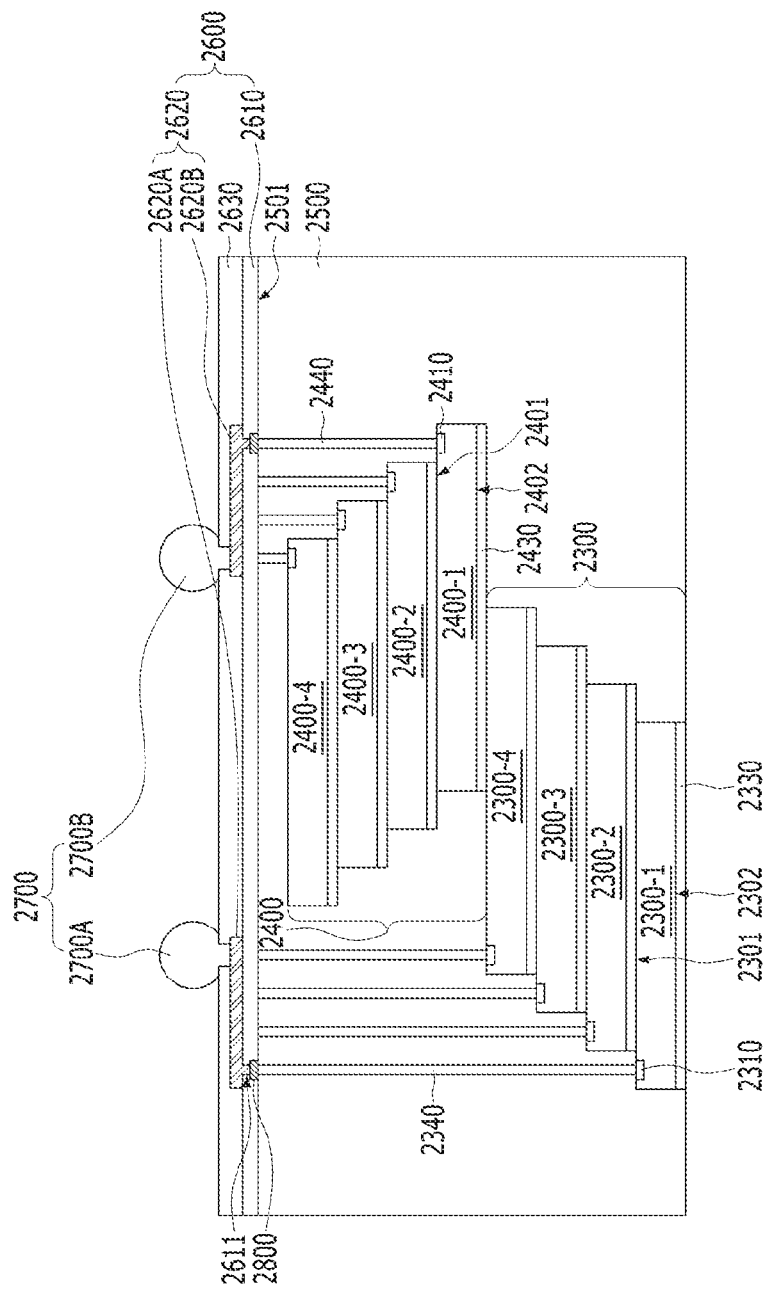
FIG. 12A is a cross-sectional view, illustrating a semiconductor package, in accordance with another embodiment.
Figure 12B:
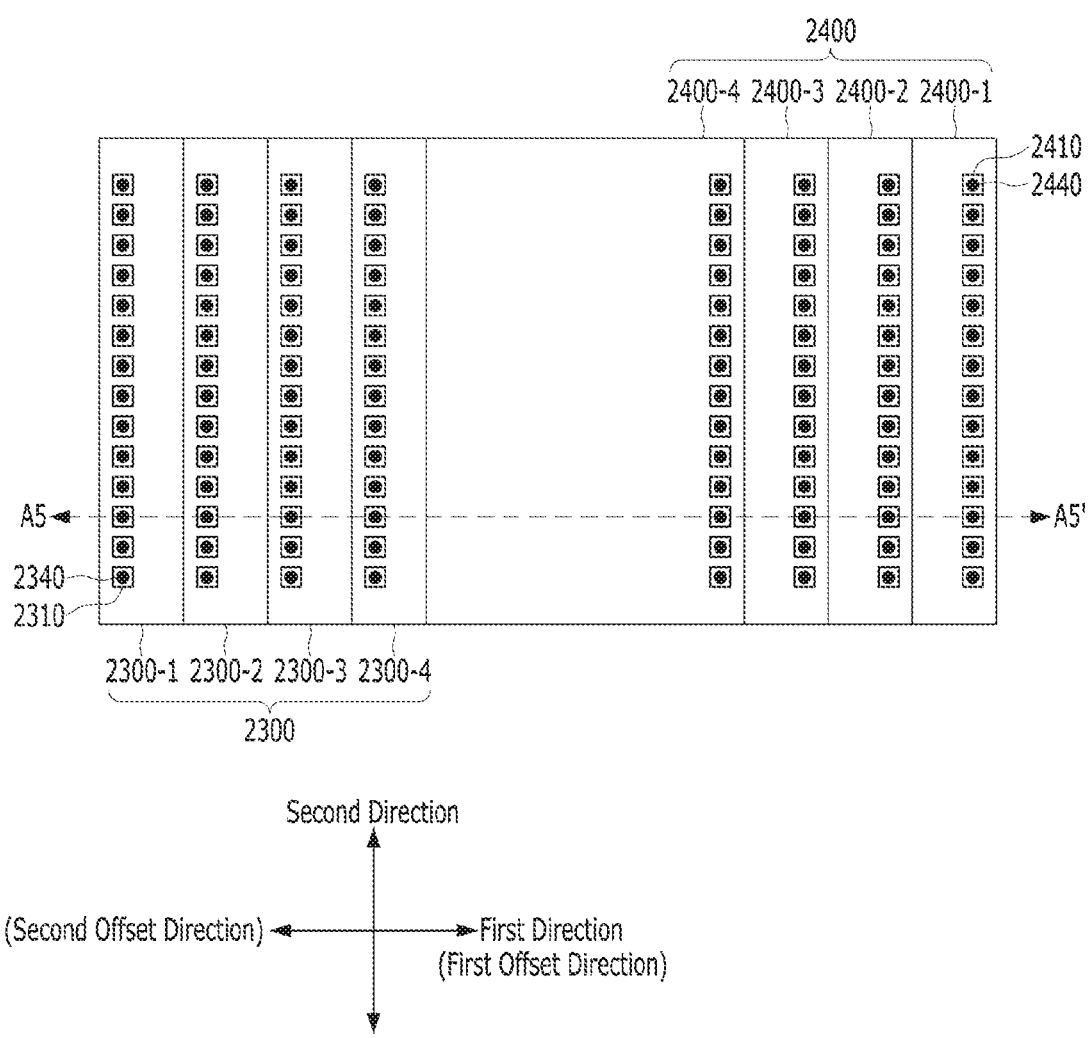
FIG. 12B is a planar view that shows first and second chip stacks and first and second vertical interconnectors of the semiconductor package of FIG. 12A.

FIG. 12A is a cross-sectional view illustrating a semiconductor package in accordance with another embodiment, and FIG. 12B is a planar view showing first and second chip stacks and first and second vertical interconnectors of the semiconductor package of FIG. 12A. FIG. 12A may include a cross-sectional view taken along a line A5-A5' of FIG. 12B.

Referring to FIGS. 12A and 12B, a semiconductor package may include a first chip stack 2300 with a plurality of first semiconductor chips 2300-1 to 2300-4 stacked in a vertical direction, and a second chip stack 2400 that is disposed over the first chip stack 2300 and includes a plurality of second semiconductor chips 2400-1 to 2400-4 stacked in the vertical direction. In this embodiment, each of the first chip stack 2300 and the second chip stack 2400 includes four semiconductor chips. However, the present disclosure is not limited thereto, and the number of semiconductor chips that are included in each of the first chip stack 2300 and the second chip stack 2400 may vary.

Each of the first semiconductor chips 2300-1 to 2300-4 may include an active surface 2301 on which first chip pads 2310 are disposed, and an inactive surface 2302 that is disposed on the opposite side of the active surface 2301. The first chip pads 2310 may be disposed at one of two edge regions of the first direction of the active surface 2301, for example, at the left side. In addition, the first chip pads 2310 may be arranged in a line in the second direction. However, the present disclosure is not limited thereto, and the arrangement of the first chip pads 2310 may vary as long as the first chip pads 2310 are disposed in any one of the two edge regions of the first direction. An adhesive layer 2330 may be formed on the inactive surface 2302 of each of the first semiconductor chips 2300-1 to 2300-4.

Each of the first semiconductor chips 2300-1 to 2300-4 may be the same memory chips, for example, NAND flash memory chips. However, the present disclosure is not limited thereto.

The first semiconductor chips 2300-1 to 2300-4 may be stacked in a face-up manner in which the active surfaces 2301 face upward. In this case, the first semiconductor chips 2300-1 to 2300-4 may be offset-stacked in a first offset direction from one side of the first direction that is adjacent to the first chip pads 2310 toward the other side that is located opposite to the one side so that all the first chip pads 2310 of the semiconductor chips 2300-1 to 2300-4 are exposed. Both sidewalls of the first semiconductor chips 2300-1 to 2300-4 in the second direction may be aligned with each other.

A first vertical interconnector 2340 may extend in the substantially vertical direction with the first end connected to the respective exposed first chip pads 2310 based on the offset-stacking. The first vertical interconnect 2340 may be a bonding wire.

Each of the second semiconductor chips 2400-1 to 2400-4 may include an active surface 2401, on which second chip pads 2410 are disposed, and an inactive surface 2402 that is disposed opposite to the active surface 2401. The second chip pads 2410 may be disposed at the other of the two edge regions of the first direction of the active surface 2401, for example, at the right side. For example, each of the second semiconductor chips 2400-1 to 2400-4 may be stacked and formed by rotating the first semiconductor chips 2300-1 to 2300-4 180 degrees about an axis in the substantially vertical direction. An adhesive layer 2430 may be formed on the inactive surface 2402 of each of the second semiconductor chips 2400-1 to 2400-4.

Each of the second semiconductor chips 2400-1 to 2400-4 may be the same memory chips, for example, NAND flash memory chips. Also, each of the second semiconductor chips 2400-1 to 2400-4 may be the same memory chips as the first semiconductor chips 2300-1 to 2300-4.

The second semiconductor chips 2400-1 to 2400-4 may be stacked in a face-up manner in which the active surfaces 2401 face upward. In this case, the second semiconductor chips 2400-1 to 2400-4 may be offset-stacked in a second offset direction that is opposite to the first offset direction so that all the second chip pads 2410 of the second semiconductor chips 2400-1 to 2400-4 are exposed. Both sidewalls of the second semiconductor chips 2400-1 to 2400-4, in the second direction, may be aligned with each other.

In addition, the second chip stack 2400 may be formed to expose all the first chip pads 2310 of the first chip stack 2300. This may be possible by increasing a distance in the offset direction between the lowermost second semiconductor chip 2400-1 of the second chip stack 2400 and the uppermost first semiconductor chip 2300-4 of the first chip stack 2300 and/or reducing an offset between the second semiconductor chips 2400-1 to 2400.

A second vertical interconnector 2440 may extend in the substantially vertical direction with first end connected to each of the exposed second chip pads 2410 based on the offset-stacking. The second vertical interconnector 2440 may be a bonding wire. Alternatively, the second vertical interconnector 2440 that is connected to the uppermost second semiconductor chip 2400-4 of a plurality of second vertical interconnectors 2440 may be a conductive bump, and the remaining second vertical interconnectors 2440 may be a bonding wire.

A molding layer 2500 may be formed to cover the first and second chip stacks 2300 and 2400 and the first and second vertical interconnectors 2340 and 2440, while having a first surface 2501 that exposes the second ends of the first and second vertical interconnectors 2340 and 2440.

A landing pad 2800 may be formed to be in contact with the second ends of the first and second vertical interconnectors 2340 and 2440 by being aligned with the first and second vertical interconnectors 2340 and 2440 on the first surface 2501 of the molding layer 2500.

A package redistribution layer 2600 may include a first redistribution dielectric layer 2610 that covers the first surface 2501 of the molding layer 2500 and the landing pad 2800, a redistribution conductive layer 2620 that is formed on the first redistribution dielectric layer 2610 and connected to the landing pad 2800 through an opening 2611 of the first redistribution dielectric layer 2610, and a second redistribution dielectric layer 2630 that covers the first redistribution dielectric layer 2610 and the redistribution conductive layer 2620. The redistribution conductive layer 2620 may include a first redistribution conductive layer 2620A that is connected to the first vertical interconnector 2340 through the landing pad 2800 and a second redistribution conductive layer 2620B that is connected to the second vertical interconnector 2440 through the landing pad 2800.

The arrangement of the landing pads 2800, the openings 2611 of the first redistribution dielectric layer 2610, and the redistribution conductive layers 2620 may be substantially the same as those described with reference to FIGS. 10A to 10C. Therefore, detailed description thereof will be omitted.

An external connection terminal 2700 may be connected to the redistribution conductive layer 2620 through an opening that is formed in the second redistribution dielectric layer 2630. The external connection terminal 2700 may include a first external connection terminal 2700A that is connected to the first redistribution conductive layer 2620A and a second external connection terminal 2700B that is connected to the second redistribution conductive layer 2620B.

Meanwhile, in the above-described embodiment of FIG. 9, the landing pad 800 may be formed to be in direct contact with the molding layer 500, unlike the redistribution conductive layer 620' that is formed on the first redistribution dielectric layer 610' of the package redistribution layer 600'. This will be described in more detail with reference to FIG. 13.

Figure 13:
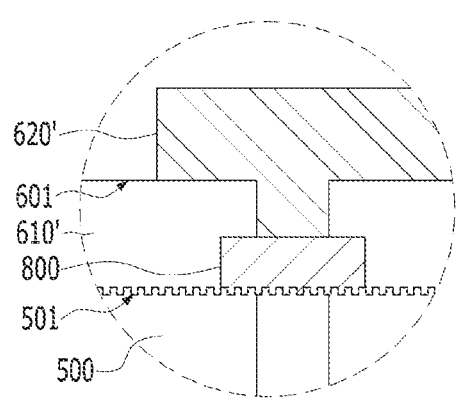
FIG. 13 is an enlarged view of a region R2 of the semiconductor package of FIG. 9.

FIG. 13 is an enlarged view of a region R2 of the semiconductor package of FIG. 9.

Referring to FIG. 13, the first surface 501 of the molding layer 500 may be rougher than the first surface 601 of the first redistribution dielectric layer 610'. One of the reasons is that the molding layer 500 contains a large amount of filler such as silica. Due to the presence of such a filler, the first surface 501 of the molding layer 500 might not be smooth despite a grinding process, and in particular, the loss of the filler that is generated during the grinding process may further increase the roughness of the first surface 501.

When the roughness of the first surface 501 of the molding layer 500 is large, the pattern shape that is formed thereon may be distorted. More specifically, in the process of forming a predetermined plating pattern on the first surface 501 of the molding layer 500 and etching a seed layer, used for the plating pattern, the degree of over-etching that is required may increase as the roughness of the first surface 501 increases, thereby increasing the loss of the plating pattern. The loss of the plating pattern may be problematic when forming a fine pattern, for example, the redistribution conductive layer 620' having a narrow line width.

In the present embodiment, the landing pad 800 with a relatively large size may be formed on the first surface 501 of the molding layer 500. Then, the first redistribution dielectric layer 610', covering the landing pad 800 and having a smaller surface roughness than the molding layer 500, may be formed. Then, the redistribution conductive layer 620' with a fine line width may be on the first redistribution dielectric layer 610'. Therefore, the semiconductor package that is not affected by the roughness of the first surface 501 of the molding layer 500 may be obtained.

Figure 14:
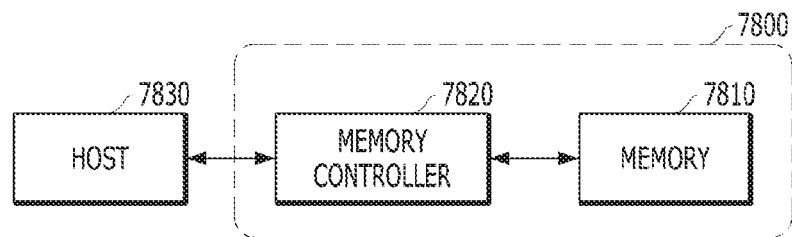
FIG. 14 shows a block diagram illustrating an electronic system employing a memory card including a semiconductor package, according to an embodiment.

FIG. 14 shows a block diagram illustrating an electronic system including a memory card 7800 employing at least one of the semiconductor packages according to the embodiments. The memory card 7800 includes a memory 7810, such as a nonvolatile memory device, and a memory controller 7820. The memory 7810 and the memory controller 7820 may store data or read out the stored data. At least one of the memory 7810 and the memory controller 7820 may include at least one of the semiconductor packages according to described embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 15:
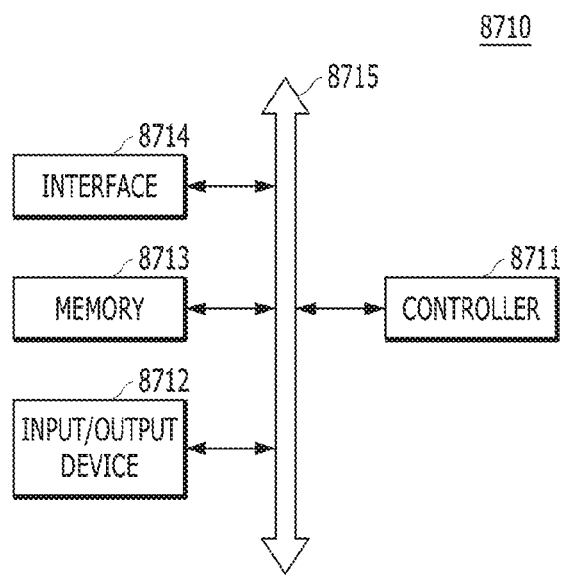
FIG. 15 shows a block diagram illustrating another electronic system including a semiconductor package, according to an embodiment.

FIG. 15 shows a block diagram illustrating an electronic system 8710 including at least one of the semiconductor packages according to described embodiments. The electronic system 8710 may include a controller 8711, an input/output device 8712, and a memory 8713. The controller 8711, the input/output device 8712, and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include one or more of the semiconductor packages according to the embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

If the electronic system 8710 represents equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDMA (wideband code division multiple access), CDMA2000, LTE (long term evolution), or Wibro (wireless broadband Internet).

Although various embodiments have been described for illustrative purposes, it will be apparent to those skilled in the art that various changes and modifications may be made without departing from the spirit and scope of the disclosure as defined in the following claims.

What is claimed is:

1. A semiconductor package comprising:
a chip stack including a plurality of semiconductor chips stacked in a vertical direction;
vertical interconnectors having first ends that are connected to the plurality of semiconductor chips, respectively, and extending in the vertical direction;
a molding layer covering the chip stack and the vertical interconnectors while exposing second ends of the vertical interconnectors;
landing pads formed over one surface of the molding layer to be in contact with the second ends of the vertical interconnectors, respectively, wherein the landing pads are conductive and overlap the first ends of the vertical interconnectors, respectively; and
a package redistribution layer electrically connected to the vertical interconnectors through the landing pads,
wherein the second ends of the vertical interconnectors include at least a first pitch for a first set of vertical interconnectors and a second pitch for a second set of vertical interconnectors, and the first pitch and the second pitch are different from each other.

2. The semiconductor package of claim 1, wherein a center of one of the landing pads overlaps with a center of a corresponding one of the first ends of the vertical interconnectors.

3. The semiconductor package of claim 1, wherein a width of each of the landing pads is greater than a width of each of the vertical interconnectors.

4. The semiconductor package of claim 1, wherein each of the semiconductor chips includes pads that are connected to the first ends of the vertical interconnectors, and
each of the landing pads has a width equal to or greater than a width of each of the pads.

5. The semiconductor package of claim 1, wherein each of the semiconductor chips includes pads connected to the first ends of the vertical interconnectors,
a pitch of the landing pads is equal to a pitch of the first ends of the vertical interconnectors and a pitch of the pads, and
a width of each of the landing pads has a value that is less than the pitch of the landing pads.

6. The semiconductor package of claim 1, wherein the package redistribution layer comprises:
a first redistribution dielectric layer formed on the one surface of the molding layer to cover the landing pads and having openings exposing the landing pads, respectively;
redistribution conductive layers formed on the first redistribution dielectric layer and each including a line portion having a relatively small width and a pad portion having a relatively large width and overlapping each of the openings, where a width of the line portion is smaller than a width of the pad portion; and
a second redistribution dielectric layer covering the first redistribution dielectric layer and the redistribution conductive layers.

7. The semiconductor package of claim 6, wherein a pitch of the landing pads, a pitch of the pad portions, a pitch of the first ends of the vertical interconnectors and a pitch of the openings are equal to each other.

8. The semiconductor package of claim 6, wherein at least two selected from a center of each of the landing pads, a center of each of the pad portions, a center of each of the first ends of the vertical interconnectors and a center of the openings overlap with each other.

9. The semiconductor package of claim 6, wherein a roughness of the one surface of the molding layer is greater than a roughness of one surface of the first redistribution dielectric layer, which faces the redistribution conductive layer.

10. The semiconductor package of claim 9, wherein the landing pads are in direct contact with the one surface of the molding layer, and
the redistribution conductive layer is in direct contact with the one surface of the first redistribution dielectric layer.

11. The semiconductor package of claim 1, wherein a portion of one of the second ends of the vertical interconnectors contacts a corresponding one of the landing pads, and
a width of the portion of the one of the second ends of the vertical interconnectors is at least ⅔ of a width of the one of the second ends of the vertical interconnectors.

12. The semiconductor package of claim 1, wherein the vertical interconnectors are bonding wires.

13. The semiconductor package of claim 1, wherein one of the vertical interconnectors, connected to an uppermost semiconductor chip of the plurality of semiconductor chips of the chip stack, includes a conductive bump, and
wherein remaining ones of the vertical interconnectors, connected to remaining semiconductor chips other than the uppermost semiconductor chip, include bonding wires.

14. The semiconductor package of claim 1, wherein the plurality of semiconductor chips are same as each other.

15. The semiconductor package of claim 1, wherein the plurality of semiconductor chips include chip pads that are formed on active surfaces facing the package redistribution layer,
wherein the plurality of semiconductor chips are offset-stacked to expose the chip pads of the plurality of semiconductor chips, and
wherein the first ends of the vertical interconnectors are connected to the chip pads.

16. The semiconductor package of claim 15, wherein the chip pads are formed in edge regions of the active surfaces, and
wherein the semiconductor chips are offset-stacked in a direction away from the edge regions.

17. The semiconductor package of claim 15, wherein the plurality of semiconductor chips include a plurality of first semiconductor chips which are offset-stacked in a first offset direction, and a plurality of second semiconductor chips which are offset-stacked in a second offset direction that is opposite to the first offset direction over the first semiconductor chips.

18. The semiconductor package of claim 17, wherein the chip pads of the first semiconductor chips are formed in first edge regions of the active surfaces,
wherein the chip pads of the second semiconductor chips are formed in second edge regions that are opposite to the first edge regions of the active surfaces,
wherein the first semiconductor chips are offset-stacked in a direction away from the first edge regions, and
wherein the second semiconductor chips are offset-stacked in a direction away from the second edge regions.

19. The semiconductor package of claim 17, wherein one of the plurality of the second semiconductor chips has a state in which one of the plurality of the first semiconductor chips is rotated by 180 degrees about an axis that is parallel to the vertical direction.

20. The semiconductor package of claim 1, wherein each of the plurality of semiconductor chips, except at least an uppermost semiconductor chip, includes: an active surface defined by two side surfaces in a first direction and two side surfaces in a second direction crossing the first direction; first one-side chip pads disposed at an edge of the active surface, which is close to one side surface in the first direction; first other-side chip pads disposed at an edge of the active surface, which is close to an other side surface in the first direction; and first redistribution pads electrically connected to the first other-side chip pads, and disposed at an edge of the active surface, which is close to one side surface in the second direction,
wherein the plurality of semiconductor chips are offset-stacked toward one side in a third direction crossing the first and second directions, the one side being away from the one side surface in the first direction and the one side surface in the second direction, in order to expose the first one-side chip pads and the first redistribution pads,
wherein the first ends of the vertical interconnectors electrically connected to the plurality of semiconductor chips, except the uppermost semiconductor chip, are connected to the first one-side chip pads and the first redistribution pads, respectively.

21. The semiconductor package of claim 20, wherein the number of the first other-side chip pads is smaller than the number of the first one-side chip pads.

22. The semiconductor package of claim 1, wherein a pitch of the landing pads is constant, a pitch of the first ends of the vertical interconnectors is constant, and the pitch of the landing pads is equal to the pitch of the first ends of the vertical interconnectors.

23. A semiconductor package comprising:
a plurality of first semiconductor chips stacked in the vertical direction;
a plurality of second semiconductor chips stacked in the vertical direction over the plurality of first semiconductor chips;
vertical interconnectors having first ends that are connected to the plurality of first and second semiconductor chips, respectively, and extending in the vertical direction;
a molding layer covering the plurality of first and second semiconductor chips and the vertical interconnectors while exposing second ends of the vertical interconnectors;
landing pads formed over one surface of the molding layer to be in contact with the second ends of the vertical interconnectors, respectively, wherein the landing pads are conductive and overlap the first ends of the vertical interconnectors, respectively; and a package redistribution layer electrically connected to the vertical interconnectors through the landing pads, wherein each of the plurality of first semiconductor chips includes: an active surface defined by two side surfaces of the first semiconductor chip in a first direction and two side surfaces of the first semiconductor chip in a second direction crossing the first direction; first one-side chip pads disposed at an edge of the active surface, which is close to one side surface in the first direction; first other-side chip pads disposed at an edge of the active surface, which is close to the other side surface in the first direction; and first redistribution pads electrically coupled to the first other-side chip pads and disposed at an edge of the active surface, which is close to one side surface in the second direction, wherein the plurality of first semiconductor chips are offset-stacked toward one side in a third direction crossing the first and second directions, the one side being spaced away from the one side surface in the first direction and the one side surface in the second direction, in order to expose the first one-side chip pads and the first redistribution pads, wherein the first ends of the vertical interconnectors that are connected to the plurality of first semiconductor chips are connected to the first one-side chip pads and the first redistribution pads, respectively, wherein the plurality of second semiconductor chips, except at least an uppermost second semiconductor chip, are in the same state as a state in which the plurality of first semiconductor chips are rotated by 180 degrees about one axis parallel to the vertical direction, and each comprise second one-side chip pads, second other-side chip pads and second redistribution pads which are located at opposite positions of the first one-side chip pads, the first other-side chip pads and the first redistribution pads, wherein the plurality of second semiconductor chips are offset-stacked in a direction that is opposite to the offset-stacking direction of the plurality of first semiconductor chips, in order to expose the second one-side chip pads and the second redistribution pads, wherein the first ends of the vertical interconnectors electrically coupled to the plurality of second semiconductor chips, respectively, except at least the uppermost second semiconductor chip, are connected to the second one-side chip pads and the second redistribution pads, respectively.

24. The semiconductor package of claim 23, wherein the number of the first other-side chip pads is smaller than the number of the first one-side chip pads, and wherein the number of the second other-side chip pads is smaller than the number of the second one-side chip pads.

* * * * *